(12) United States Patent
Camm et al.

(10) Patent No.: US 9,482,468 B2
(45) Date of Patent: Nov. 1, 2016

(54) REPEATABLE HEAT-TREATING METHODS AND APPARATUS

(75) Inventors: David Malcolm Camm, Vancouver (CA); Sergiy Dets, Richmond (CA); Kevin McDonnell, Burnaby (CA); Greg Stuart, Burnaby (CA); Tilman Thrum, Richmond (CA); Igor Rudic, Vancouver (CA); Ljubomir Kaludjercic, Vancouver (CA)

(73) Assignee: Mattson Technology, Inc., Fremont, CA (US)

( * ) Notice: Subject to any disclaimer, the term of this patent is extended or adjusted under 35 U.S.C. 154(b) by 2995 days.

(21) Appl. No.: 11/521,074

(22) Filed: Sep. 14, 2006

(65) Prior Publication Data

US 2007/0069161 A1 Mar. 29, 2007

Related U.S. Application Data

(60) Provisional application No. 60/716,488, filed on Sep. 14, 2005.

(51) Int. Cl.
*G01J 5/00* (2006.01)
*G01J 5/58* (2006.01)
(Continued)

(52) U.S. Cl.
CPC ..... *F27B 17/0025* (2013.01); *H01L 21/67115* (2013.01); *H01L 21/67248* (2013.01); *H01L 22/20* (2013.01)

(58) Field of Classification Search
CPC ................ G01J 5/00; G01J 5/06; G01J 5/58; G01J 3/108; G01J 2005/0081; G01J 5/0896; G01N 25/72
USPC ....... 374/1, 2, 4, 5, 43–45, 29–30, 120, 121, 374/129, 130, 131, 137, 141, 160–162, 374/178; 250/338.1, 504 R, 128, 127, 124, 250/163, 166, 167
See application file for complete search history.

(56) References Cited

U.S. PATENT DOCUMENTS 2,794,938 A * 6/1957 Moerkens ...................... 315/138
3,963,945 A * 6/1976 Colyn ............................ 327/184
(Continued)

FOREIGN PATENT DOCUMENTS

JP 54048414 A * 4/1979
JP 60-258928 12/1985
(Continued)

OTHER PUBLICATIONS

Combined International Search Report and Written Opinion for PCT/CA2006/001518 (PCT counterpart to this application).
(Continued)

*Primary Examiner* — Gail Kaplan Verbitsky
(74) *Attorney, Agent, or Firm* — Knobbe Martens Olson & Bear LLP

(57) ABSTRACT

A first heat-treating method involves monitoring at least one thermal efficiency parameter associated with an irradiance system configured to produce an irradiance flash incident on a surface of a workpiece, and automatically updating control information used by the irradiance system to produce the irradiance flash, in response to the monitoring of the thermal efficiency parameter. A second method involves predicting a heating effect of an irradiance flash to be incident upon a surface of a workpiece, in response to a measurement of a heating parameter of the surface, and pre-adjusting the irradiance flash, in response to the predicted heating effect. A third method involves measuring a temperature of a surface of a workpiece during an initial portion of an irradiance flash incident on the surface, and controlling a power of a remaining portion of the irradiance flash, in response to the temperature.

59 Claims, 11 Drawing Sheets

(51) Int. Cl.
*F27B 17/00* (2006.01)
*H01L 21/67* (2006.01)
*H01L 21/66* (2006.01)

(56) References Cited

U.S. PATENT DOCUMENTS

| | | | |
|---|---|---|---|
| 4,255,046 A * | 3/1981 | Corona | 355/68 |
| 4,539,431 A | 9/1985 | Moddel et al. | |
| 4,698,486 A | 10/1987 | Sheets | |
| 4,789,992 A * | 12/1988 | Wickersheim et al. | 374/161 |
| 4,881,013 A * | 11/1989 | Kataoka et al. | 315/241 P |
| 5,188,458 A | 2/1993 | Thompson et al. | 374/121 |
| 5,497,051 A | 3/1996 | Langhans et al. | 315/200 |
| 5,561,735 A | 10/1996 | Camm | 392/416 |
| 5,660,472 A | 8/1997 | Peuse et al. | |
| 5,747,944 A * | 5/1998 | Harada | 315/241 P |
| 5,755,511 A | 5/1998 | Peuse et al. | |
| 5,823,681 A * | 10/1998 | Cabib et al. | 374/126 |
| 5,841,110 A | 11/1998 | Nenyei et al. | 219/497 |
| 5,848,842 A | 12/1998 | Peuse et al. | |
| 6,056,434 A | 5/2000 | Champetier | |
| 6,142,663 A * | 11/2000 | Takasuka | 374/121 |
| 6,179,466 B1 | 1/2001 | Peuse et al. | |
| 6,262,855 B1 * | 7/2001 | Greisz | 359/885 |
| 6,303,411 B1 | 10/2001 | Camm et al. | 438/149 |
| 6,391,690 B2 | 5/2002 | Miyasaka | |
| 6,534,752 B2 | 3/2003 | Camm et al. | 219/497 |
| 6,535,628 B2 | 3/2003 | Smargiassi et al. | 382/149 |
| 6,594,446 B2 | 7/2003 | Camm et al. | 392/416 |
| 6,621,199 B1 | 9/2003 | Parfeniuk et al. | 313/231.51 |
| 6,630,991 B2 | 10/2003 | Kitamura et al. | |
| 6,660,572 B2 | 12/2003 | Miyasaka | |
| 6,798,142 B2 | 9/2004 | Eguchi | 315/115 |
| 6,849,831 B2 | 2/2005 | Timans et al. | 219/390 |
| 6,855,916 B1 | 2/2005 | Matthews et al. | 219/390 |
| 6,888,319 B2 * | 5/2005 | Inochkin et al. | 315/243 |
| 6,897,130 B2 | 5/2005 | Miyauchi et al. | 438/502 |
| 6,941,063 B2 | 9/2005 | Camm et al. | 392/416 |
| 6,963,692 B2 | 11/2005 | Camm et al. | 392/416 |
| 6,970,644 B2 | 11/2005 | Koren et al. | |
| 7,001,829 B1 | 2/2006 | Yamazaki | |
| RE39,145 E * | 6/2006 | Perry et al. | 356/630 |
| 7,184,657 B1 | 2/2007 | Camm et al. | 392/418 |
| 7,186,981 B2 * | 3/2007 | Shepard et al. | 250/341.1 |
| 7,223,660 B2 * | 5/2007 | Hwang | 438/289 |
| 7,318,661 B2 * | 1/2008 | Catalano | 362/297 |
| 7,381,928 B2 * | 6/2008 | Kusuda et al. | 219/411 |
| 7,501,332 B2 * | 3/2009 | Ito et al. | 438/528 |
| 2001/0006067 A1 * | 7/2001 | Saitou | 131/88 |
| 2002/0113060 A1 * | 8/2002 | Sandhu | 219/497 |
| 2004/0178553 A1 | 9/2004 | Camm et al. | 269/55 |
| 2004/0263090 A1 | 12/2004 | Erlbacher et al. | 315/241 |
| 2005/0018196 A1 | 1/2005 | Kusuda | 356/448 |
| 2005/0018748 A1 * | 1/2005 | Ringermacher et al. | 374/121 |
| 2005/0062388 A1 * | 3/2005 | Camm et al. | 313/231.71 |
| 2005/0063448 A1 | 3/2005 | Kusuda | 374/1 |
| 2005/0063453 A1 | 3/2005 | Camm et al. | 374/161 |
| 2005/0133167 A1 | 6/2005 | Camm et al. | 156/345.51 |
| 2005/0162998 A1 * | 7/2005 | Iwasaki et al. | 369/44.32 |
| 2005/0179354 A1 | 8/2005 | Camm et al. | 313/231.51 |
| 2006/0096677 A1 | 5/2006 | Camm et al. | 148/565 |
| 2006/0201927 A1 | 9/2006 | Gat et al. | |
| 2006/0225657 A1 * | 10/2006 | Mizushima et al. | 118/724 |
| 2007/0052373 A1 * | 3/2007 | Hui et al. | 315/291 |
| 2007/0235662 A1 * | 10/2007 | Tien et al. | 250/453.11 |
| 2008/0186836 A1 * | 8/2008 | Tanaka et al. | 369/112.24 |
| 2009/0067823 A1 | 3/2009 | Kusuda | 392/418 |
| 2009/0102083 A1 * | 4/2009 | Cochran et al. | 264/40.6 |
| 2009/0103906 A1 | 4/2009 | Kusuda | 392/418 |
| 2009/0166351 A1 | 7/2009 | Yokomori | 219/492 |
| 2009/0263112 A1 | 10/2009 | Kiyama et al. | 392/418 |
| 2009/0285568 A1 | 11/2009 | Kiyama et al. | 392/418 |
| 2010/0012649 A1 * | 1/2010 | Cho | 219/690 |
| 2010/0111513 A1 | 5/2010 | Nishihara et al. | 392/418 |

FOREIGN PATENT DOCUMENTS

| | | | |
|---|---|---|---|
| JP | 61-198735 | 9/1986 | |
| JP | 62-015826 | 1/1987 | |
| JP | 62-112322 | 5/1987 | |
| JP | 63-188940 | 8/1988 | |
| JP | 2-294027 | 12/1990 | |
| JP | 03-221821 | 9/1991 | |
| JP | 5-216099 | 8/1993 | |
| JP | 06004002 A * | 1/1994 | |
| JP | 06147891 A * | 5/1994 | |
| JP | 07-201765 | 8/1995 | |
| JP | 08-255800 | 10/1996 | |
| JP | 10-070085 | 3/1998 | |
| JP | 10-504936 | 5/1998 | |
| JP | 2000-003875 | 1/2000 | |
| JP | 2001-304971 | 10/2001 | |
| JP | 2003007633 A * | 1/2003 | |
| JP | 2005-079336 | 3/2005 | |
| JP | 2005-243797 | 9/2005 | |
| WO | WO 97/22142 | 6/1997 | |
| WO | WO 03/060447 | 7/2003 | G01J 5/10 |
| WO | WO 2004/057650 | 7/2004 | H01L 21/00 |
| WO | WO 2005/029014 | 3/2005 | H03K 3/00 |
| WO | WO 2007/030941 | 3/2007 | G05D 23/19 |

OTHER PUBLICATIONS

International Preliminary Report on Patentability for PCT/CA2006/001518 (PCT counterpart to this application).

Barak, M., "Optimal Design of Pulse Forming Networks and Flash Lamps for Thermal Flash Process", pp. 79-88, 12th IEEE International Conference on Advanced Thermal Processing of Semiconductors—RTP 2004.

Xu. et al. "Measurement of Solid-Liquid Interface Temperature During Pulsed Excimer Laser Melting of Polycrystalline Silicon Films," *Applied Physical Letters*, vol. 65, No. 14, pp. 1745-1747, Oct. 3, 1994.

* cited by examiner

REPEATABLE HEAT-TREATING METHODS AND APPARATUS

CROSS-REFERENCE TO RELATED APPLICATIONS

This application claims the benefit of priority from U.S. patent application Ser. No. 60/716,488 filed Sep. 14, 2005.

FIELD OF THE INVENTION

The present invention relates to heat-treating, and more particularly, to methods and systems for heat-treating a workpiece.

BACKGROUND OF THE INVENTION

Numerous applications involve heat-treating a workpiece. For example, commonly-owned U.S. Pat. No. 6,594,446 discloses various methods of annealing a semiconductor wafer, which may involve, for example, pre-heating the entire wafer to an intermediate temperature at a ramp rate slower than the thermal conduction rate through the wafer, then heating the device side of the wafer at a rate much faster than the thermal conduction rate, which may be achieved by exposing the device side to an irradiance flash. As an arbitrary example, the wafer may be pre-heated to an intermediate temperature such as 700° C. for example, by irradiating the substrate side with an arc lamp to heat the entire wafer at a rate such as 400° C./second, for example. The device side may then be exposed to a high-intensity flash from a flash lamp, such as a one-millisecond flash, to heat only the device side to an annealing temperature such as 1300° C., for example. Due to the rapid heating rate of the device side during the flash (on the order of $10^{5}$° C./s), the bulk of the wafer remains at the intermediate temperature, and acts as a heat sink to then cool the device side following the flash.

SUMMARY OF THE INVENTION

To minimize performance variations from wafer to wafer, it is desirable to ensure that each wafer is subjected to a consistently reproducible or repeatable thermal process, as close as possible to an identical thermal cycle from wafer to wafer.

The efficiency of a thermal processing system may vary over time. For example, the efficiency of the system may decrease as a result of deterioration, contamination or aging of components, or may increase if such components are replaced. A first aspect or embodiment of the invention relates to compensating for this problem.

In addition, heating parameters of the workpiece itself, such as the emissivity of the surface to be irradiated, may significantly influence repeatability. For example, in embodiments in which the workpiece is a semiconductor wafer and the surface to be irradiated is a device side of the wafer, device sides of different wafers tend to have different emissivities. It has been found that such emissivity differences may exist even among a group of ostensibly identical wafers. Depending upon the precise nature of the equipment used in a particular system, these wafer-to-wafer emissivity variations may be the dominant source of unintended wafer-to-wafer variations in the thermal cycle to which the wafers are subjected. A second aspect or illustrative embodiment of the invention relates to this problem.

A third aspect or embodiment of the invention relates to real-time feedback control of an irradiance flash, while the flash is in progress. Advantageously, differences between the heating effects of successive flashes on respective workpieces may be compensated for by performing such feedback control.

A fourth aspect or embodiment of the invention relates to supplying an advantageous form of electrical pulse to an irradiance device for producing an irradiance flash to be incident upon a surface of a workpiece.

In accordance with one aspect or embodiment of the invention, there is provided a method including monitoring at least one thermal efficiency parameter of an irradiance system configured to produce an irradiance flash incident on a surface of a workpiece. The method further includes automatically updating control information used by the irradiance system to produce the irradiance flash, in response to the monitoring of the thermal efficiency parameter.

Advantageously, by automatically updating control information used to produce the irradiance flash in response to automatic monitoring of a thermal efficiency parameter of the system, the system may automatically compensate for changes in efficiency of the system over time, such as deterioration, contamination, aging or replacement of system components, for example. A self-adjusting system may thus be provided, advantageously avoiding the need for frequent manual recalibration.

Monitoring may include calculating the at least one thermal efficiency parameter in response to a measurement of an actual temperature increase. of the surface of the workpiece caused by the irradiance flash.

Alternatively, or in addition, monitoring may include monitoring energy density of radiant energy of the flash arriving at the surface.

Automatically updating may include automatically updating at least one stored efficiency parameter.

Automatically updating may include automatically varying an output energy of the irradiance flash. For example, this may include automatically varying an amount of stored electrical charge used to produce the irradiance flash.

The method may further include predicting a heating effect of the irradiance flash upon the surface of the workpiece, in response to a measurement of a heating parameter of the surface, and pre-adjusting the irradiance flash, in response to the predicted heating effect.

Predicting may include predicting respective heating effects of a similar irradiance flash to be incident upon respective surfaces of a plurality of similar workpieces, in response to respective measurements of respective heating parameters of the respective surfaces.

The workpieces may be ostensibly identical. Alternatively, the workpieces may be different.

Predicting the heating effect of the irradiance flash may include predicting a peak temperature of the surface.

Alternatively, or in addition, predicting the heating effect of the irradiance flash may include predicting an amount of energy of the irradiance flash to be absorbed by the surface.

The method may further include measuring the heating parameter of the surface. This may include measuring a reflectivity of the surface. Alternatively, or in addition, this may include measuring an emissivity of the surface.

Measuring may include measuring the heating parameter in a wavelength spectrum corresponding to the irradiance flash. For example, this may include measuring a plurality of values of the heating parameter at a plurality of respective wavelengths of the spectrum.

Measuring the heating parameter may include compensating for small-scale angular variations in the heating parameter. Compensating may include measuring the heating parameter over a sufficiently large area of the surface to effectively average out the small-scale angular variations. For example, the surface may include a device side of a semiconductor wafer, and measuring the heating parameter over a sufficiently large area may include measuring the heating parameter over an area at least about 1 cm wide. As a more particular example, measuring may include measuring the heating parameter over an area at least about 2 cm wide.

Measuring may include measuring the heating parameter with a fiber optic probe.

Measuring the emissivity may include illuminating the surface with an irradiance spectrum including wavelengths of the irradiance flash. Illuminating may include illuminating the surface with an irradiance spectrum produced by an illumination source other than a source of the irradiance flash. If so, the illumination source may further include a filter configured to simulate an irradiance spectrum of the source of the irradiance flash.

Pre-adjusting may include pre-adjusting a future irradiance flash to be incident upon a first surface of a first workpiece, contemporaneously with an incidence of a present irradiance flash upon a similar surface of a second workpiece.

Predicting the heating effect may include predicting the heating effect in response to a measurement of an emissivity of the surface and an amount of energy to be delivered to the surface by the irradiance flash.

Predicting the heating effect may include convolving the plurality of values of the heating parameter at the plurality of respective wavelengths of the spectrum with a plurality of irradiance values indicative of respective amounts of irradiance at the respective wavelengths to be delivered to the surface by the flash. For example, convolving may include convolving a plurality of absorptivity values of the surface at the plurality of respective wavelengths with a plurality of irradiance energy values indicative of respective amounts of radiant energy at the respective wavelengths to be delivered to the surface by the flash.

Predicting the heating effect may further include summing a plurality of absorbed energy values resulting from the convolving.

Pre-adjusting may include pre-adjusting an amount of stored electrical energy to be used to generate the irradiance flash. The stored electrical energy may include electrical charge stored in a capacitor bank.

The method may further include generating the irradiance flash incident upon the surface of the workpiece, measuring a temperature of the surface of the workpiece during an initial portion of the irradiance flash incident on the surface, and controlling a power of a remaining portion of the irradiance flash, in response to the temperature.

The irradiance flash may have a duration of less than a thermal conduction time of the workpiece.

The irradiance flash may deliver energy to the surface at a rate of at least about 1 MW.

The initial portion of the flash may have a duration of less than about one millisecond. For example, the initial portion may have a duration of less than about one-half millisecond.

Measuring the temperature may include obtaining a plurality of measurements of the temperature of the surface at a plurality of respective times during the initial portion of the irradiance flash.

Measuring the temperature may include measuring the temperature with a high-speed radiometer. For example, the radiometer may include an InGaAs photodiode.

The method may further include comparing the temperature to an expected temperature. In embodiments in which a plurality of temperature measurements are obtained, the method may further include comparing at least one of the plurality of temperature measurements to an expected temperature trajectory.

Controlling may include modifying the remaining portion of the irradiance flash to reduce a peak temperature of the surface. Modifying may include reducing an energy output of the remaining portion of the irradiance flash.

Reducing may include firing a crowbar circuit in communication with a source of the irradiance flash and an electrical power supply of the source. Reducing may include firing a crowbar circuit connected in parallel with a flash lamp or a capacitor bank.

Controlling may include modifying the remaining portion of the irradiance flash to increase a peak temperature of the surface. For example, controlling may include increasing a peak power output of the remaining portion of the irradiance flash. Increasing may include firing an inductive crowbar circuit in communication with a source of the irradiance flash and an electrical power supply of the source.

The irradiance flash may be produced by an arc lamp powered by an electric current discharge, wherein the electric current discharge travels through a first electrical path having a first inductance to produce the initial portion of the irradiance flash, and increasing may include causing the electric current discharge to travel through a second electrical path having a second inductance less than the first inductance.

Increasing may further include discharging a capacitor through the arc lamp.

The method may further include supplying an electrical pulse to an irradiance device configured to produce the irradiance flash incident on the workpiece, wherein a fall time of the pulse is less than a rise time of the pulse.

The pulse may include a sawtooth-shaped pulse, for example.

Supplying may include causing the pulse to abruptly transition from the rise time to the fall time. Causing may include firing a crowbar circuit to cause the pulse to transition from the rise time to the fall time. Causing may include shorting across the irradiance device to cause the pulse to transition from the rise time to the fall time.

In accordance with another illustrative embodiment of the invention, there is provided an apparatus including means for monitoring at least one thermal efficiency parameter of an irradiance system configured to produce an irradiance flash incident on a surface of a workpiece, and means for automatically updating control information used by the irradiance system to produce the irradiance flash, in response to the monitoring of the thermal efficiency parameter.

The apparatus may further include means for predicting a heating effect of the irradiance flash to be incident upon the surface of the workpiece, in response to a measurement of a heating parameter of the surface, and means for pre-adjusting the irradiance flash, in response to the predicted heating effect.

The apparatus may further include means for generating the irradiance flash incident upon the surface of the workpiece, means for measuring a temperature of the surface of the workpiece during an initial portion of the irradiance flash incident on the surface, and means for controlling a power of a remaining portion of the irradiance flash, in response to the temperature.

The apparatus may further include means for supplying an electrical pulse to an irradiance device configured to produce the irradiance flash incident on the workpiece, wherein a fall time of the pulse is less than a rise time of the pulse.

In accordance with another illustrative embodiment of the invention, there is provided an apparatus including a measurement system configured to monitor at least one thermal efficiency parameter associated with an irradiance system configured to produce an irradiance flash incident on a surface of a workpiece, and a processor circuit in communication with the measurement system. The processor circuit is configured to automatically update control information used by the irradiance system to produce the irradiance flash, in response to the monitoring of the thermal efficiency parameter.

The apparatus may further include the irradiance system configured to produce the irradiance flash incident on the surface of the workpiece, and the processor circuit may be in communication with the irradiance system. The processor circuit may be configured to predict a heating effect of the irradiance flash in response to a measurement of a heating parameter of the surface, and to pre-adjust the irradiance flash, in response to the predicted heating effect.

The measurement system may be configured to measure a temperature of the surface of the workpiece during an initial portion of the irradiance flash incident on the surface, and the processor circuit may be in communication with the measurement system and with the irradiance system. The processor circuit may be configured to control a power of a remaining portion of the irradiance flash in response to the temperature.

The apparatus may further include an electrical pulse supply configured to supply an electrical pulse to the irradiance system to produce the irradiance flash incident on the surface of the workpiece, wherein a fall time of the pulse is less than a rise time of the pulse.

In accordance with another aspect or embodiment of the invention, there is provided a method including predicting a heating effect of an irradiance flash to be incident upon a surface of a workpiece, in response to a measurement of a heating parameter of the surface. The method may further include pre-adjusting the irradiance flash, in response to the predicted heating effect.

Advantageously, by pre-adjusting the irradiance flash in this manner, the flash may be pre-adjusted to compensate for workpiece-to-workpiece variations in the measured heating parameter (which may include the reflectivity of the surface to be heated). Thus, repeatability of the thermal cycle from workpiece to workpiece is improved. In addition, such a method may facilitate thermal processing of workpieces whose thermal properties have not been previously determined.

In accordance with another aspect or embodiment of the invention, there is provided a method including measuring a temperature of a surface of a workpiece during an initial portion of an irradiance flash incident on the surface, and controlling a power of a remaining portion of the irradiance flash, in response to the temperature.

If desired, this latter power-controlling aspect may be combined with the previous aspect relating to pre-adjustment of the irradiance flash. Thus, in accordance with another aspect or embodiment of the invention, there is provided a method including predicting a heating effect of an irradiance flash to be incident upon a surface of a workpiece in response to a measurement of a heating parameter of the surface, pre-adjusting the irradiance flash in response to the predicted heating effect, generating the pre-adjusted irradiance flash incident upon the surface of the workpiece, measuring a temperature of the surface of the workpiece during an initial portion of the irradiance flash incident on the surface, and controlling a power of a remaining portion of the irradiance flash in response to the temperature.

Advantageously, in such an embodiment, the pre-adjustment of the irradiance flash may be used to effectively reduce the magnitude of flash power adjustments made in the course of controlling the power of the remaining portion of the flash. Such a combination of these two aspects may enable correction of errors that might otherwise be too large for the latter power-controlling aspect to correct on its own. Additionally, such a combination of these two aspects may also permit consistent thermal cycles to be achieved with a lesser degree of power-control intervention during the remaining portion of the flash itself, thereby resulting in more consistent pulse shapes and temperature-time curves from cycle to cycle. Alternatively, however, the power-controlling aspect may be practised without such pre-adjustment, if desired.

In accordance with another aspect or embodiment of the invention, there is provided a method of heat-treating a workpiece. The method includes supplying an electrical pulse to an irradiance device configured to produce an irradiance flash incident on the workpiece, wherein a fall time of the pulse is less than a rise time of the pulse.

In accordance with another aspect or embodiment of the invention, there is provided an apparatus including a processor circuit configured to control a thermal processing system to cause any one or more of the methods described herein to be carried out.

In accordance with another aspect or embodiment of the invention, there is provided an apparatus including means for carrying out any or all of the various functions described herein.

In accordance with another aspect or embodiment of the invention, there is provided a computer-readable medium storing instruction codes for directing a processor circuit to cause any one or more of the methods described herein to be carried out.

In accordance with another aspect or embodiment of the invention, there is provided a signal embodied in a medium, the signal including code segments for directing a processor circuit to cause any one or more of the methods described herein to be carried out.

Any number of such embodiments comprising such apparatuses, media or signals may be provided, to cause any combination of functions described herein to be carried out.

In accordance with other aspects or embodiments of the invention, any combination or subcombination of the other aspects described herein may be combined in a single embodiment, if desired. For example, the aspect relating to automatically updating control information in response to the monitored thermal efficiency parameter may be combined with any one or more of the aspects relating to pre-adjusting the irradiance flash in response to the predicted heating effect, controlling the power of the remaining portion of the flash in response to the measured surface temperature during the initial portion of the flash, and supplying an electrical pulse whose fall time is less than its rise time to the irradiance device. In one illustrative embodiment, all of the aspects described herein may be practised. More generally, each one of the aspects described herein may be combined with any one or more of the other aspects described herein. Alternatively, any one of the aspects of the invention may be practised alone in a particular embodiment, without the remaining aspects, if desired.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
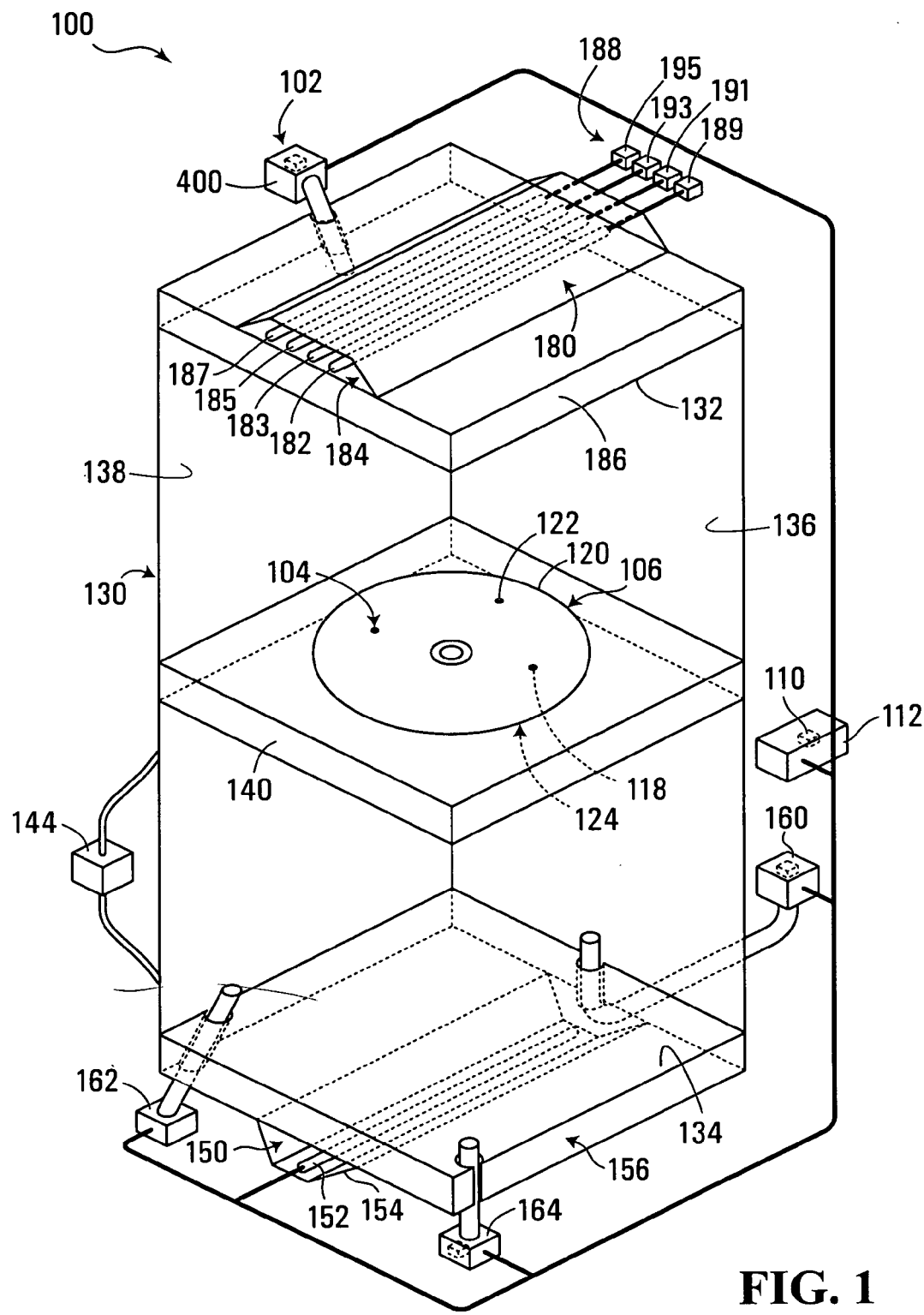
FIG. 1 is a perspective view of a rapid thermal processing (RTP) system according to a first embodiment of the invention, shown with two vertical front-side walls removed.

Referring to FIG. 1, a rapid thermal processing (RTP) system according to a first embodiment of the invention is shown generally at 100. In this embodiment, the system 100 includes an irradiance system 180 configured to produce an irradiance flash incident on a surface 104 of a workpiece 106, a measurement system 102, and a processor circuit 110 in communication with the measurement system 102 and with the irradiance system 180. In the present embodiment, the measurement system 102 is configured to monitor at least one thermal efficiency parameter of the irradiance system 180, and the processor circuit 110 is configured to automatically update control information used by the irradiance system 180 to produce the irradiance flash, in response to the monitoring of the thermal efficiency parameter.

In this embodiment, the measurement system 102 is also configured to measure a temperature of the surface 104 of the workpiece 106 during an initial portion of the irradiance flash incident on the surface 104. In this embodiment, the processor circuit 110 is configured to control a power of a remaining portion of the irradiance flash, in response to the measured temperature.

In the present embodiment, the processor circuit 110 is configured to predict a heating effect of the irradiance flash, in response to a measurement of a heating parameter of the surface 104. In this embodiment, the processor circuit 110 is also configured to pre-adjust the irradiance flash, in response to the predicted heating effect.

Rapid Thermal Processing Chamber

In the present embodiment, the system 100 is used for heat-treating the workpiece 106. In this embodiment, the workpiece 106 includes a semiconductor wafer 120. More particularly, in this embodiment the wafer 120 is a 300 mm diameter silicon semiconductor wafer for use in the manufacture of semiconductor chips, such as microprocessors, for example. In the present embodiment, the first surface 104 of the workpiece 106 includes a top-side or device side 122 of the wafer 120. Similarly, in this embodiment a second surface 118 of the workpiece includes a back-side or substrate side 124 of the wafer 120.

In this embodiment, to carry out such heat-treating of the wafer 120, the wafer is supported within a rapid thermal processing chamber 130. In this embodiment, the chamber 130 is somewhat similar to that disclosed in commonly-owned Patent Cooperation Treaty Publication No. WO 03/060447 (which is incorporated herein by reference), and includes radiation-absorbing regions both above and below the workpiece. The chamber 130 includes top and bottom selectively radiation-absorbing walls 132 and 134, as well as side walls, two of which are shown at 136 and 138 and the other two of which are removed for illustrative purposes. In this embodiment, the side walls 136 and 138 (as well as the further side walls not shown) include specularly reflective diamond-turned aluminum surfaces, however, they cooperate with the top and bottom walls 132 and 134, which include selectively absorbing water-cooled windows.

In this embodiment, the chamber 130 further includes an internal wall 140 having a cavity in which the workpiece 106 is supported. In this embodiment, the workpiece is supported in its cavity by a workpiece support system (not shown) similar to that disclosed in Patent Cooperation Treaty Publication No. WO 2004/057650 (which is hereby incorporated herein by reference). Alternatively, however, the workpiece may be supported in a more conventional manner, such as by a plurality of quartz pins (not shown), for example. More generally, other suitable means for supporting the workpiece may be substituted.

The internal wall 140 may be either radiation-absorbing or reflective, depending on the particular application, with the reflective surface being more energy-efficient, but a radiation-absorbing surface resulting in greater uniformity of heating. Alternatively, a compromise between these extremes may be provided, such as a partly reflective, partly absorptive surface, such as anodized aluminum, for example. Similarly, if desired, the various reflective surfaces of the chamber 130 may be replaced by fully or partly radiation-absorbing surfaces. All of the surfaces of the chamber are preferably cooled via a cooling system 144, which in this embodiment includes a circulated water cooling system.

In this embodiment, due to the reflectivity of the surface 104 of the workpiece 106, the surface 104 tends to act as a patterned mirror, reflecting an image of a portion (not shown) of the chamber 130 to the measurement system 102.

In the present embodiment, this imaged portion of the chamber 130 has been made as black as possible, to attempt to prevent the measurement system 102 from detecting electromagnetic radiation reflected by the surface 104.

In this embodiment, the system 100 further includes a pre-heating device 150 for pre-heating the wafer 120. In this embodiment the pre-heating device 150 includes a high-intensity arc lamp 152 and a reflector system 154 disposed beneath the bottom wall 134 of the chamber 130. In this embodiment, the bottom wall 134 effectively includes a filter through which the arc lamp 152 and the reflector system 154 of the pre-heating device 150 are operable to project electromagnetic radiation to heat the wafer 120. More particularly, in this embodiment the bottom wall 134 includes a water-cooled window 156. More particularly still, in this embodiment the water-cooled window 156 includes two parallel spaced-apart quartz panes defining a cooling channel therebetween, through which water is pumped by the cooling system 144. In this embodiment, the water-cooled window transmits most of the irradiance from the arc lamp 152 to the workpiece 106, but absorbs irradiance at 1450 nm.

The system 100 may further include a plurality of additional measurement devices, such as a diagnostic illumination source 160, and radiation detectors such as an imaging device 162 and a fast radiometer 164 for example, which may be used as described in the aforementioned commonly-owned PCT publication no. WO 03/060447, if desired. In this embodiment, the measurement system 102, the imaging device 162 and the fast radiometer 164 operate at the diagnostic wavelength of 1450 nm, facilitating measurements of the wafer temperature and its optical properties.

In the present embodiment, the system 100 further includes the irradiance system 180, which is configured to produce the irradiance flash incident upon the first surface 104 of the workpiece 106. More particularly, in this embodiment the irradiance system 180 includes a flash lamp system. More particularly still, in this embodiment the irradiance system 180 includes first, second, third and fourth flash lamps 182, 183, 185 and 187 and a reflector system 184, positioned immediately above the upper wall 132 of the chamber 130. Alternatively, fewer than four flash lamps, such as a single flash lamp for example, may be employed. Conversely, more than four flash lamps, such as an array of a much larger number of flash lamps for example, may be employed. Or as a further alternative, other types of irradiance devices, such as a microwave flash or pulse generator for example, may be substituted for the flash lamps. In this embodiment, the upper wall 132 includes a water-cooled window 186, similar to the water-cooled window 156 discussed above.

In the present embodiment, the irradiance system 180 further includes a power supply system 188 for supplying electrical power to the flash lamps 182, 183, 185 and 187 to produce the irradiance flash. In this embodiment, the power supply system 188 includes individual electrical power supply systems 189, 191, 193 and 195, for supplying electrical power to the individual flash lamps 182, 183, 185 and 187, respectively. Alternatively, however, the flash lamps 182, 183, 185 and 187 may be powered by a single common electrical power supply, if desired.

In this embodiment, prior to the insertion of the wafer 120 into the chamber 130, the device side 122 of the wafer is subjected to an ion implantation process, which introduces impurity atoms or dopants into a surface region of the device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, the surface region of the device side of the wafer is annealed by heating it to a high temperature.

In the present embodiment, such annealing is carried out according to methods similar to those disclosed in commonly-owned U.S. Pat. Nos. 6,594,446 and 6,941,063, both of which are hereby incorporated herein by reference, and in the aforementioned PCT publication no. WO 03/060447. For example, a first stage of the annealing method may include pre-heating the wafer to an intermediate temperature, at a rate that is slower than a thermal conduction time through the wafer, so that the entire wafer is heated relatively uniformly to the intermediate temperature. In this embodiment, this pre-heating stage is achieved by irradiating the back-side or substrate side 124 of the wafer with the arc lamp 152, to heat the wafer at a ramp rate such as 100° C. per second to 400° C. per second, to an intermediate temperature such as 700° C., for example. Following the pre-heating stage, the top-side or device side 122 of the wafer is rapidly heated to a substantially higher annealing temperature, at a rate much faster than the thermal conduction time through the wafer, so that only the top-side surface region of the wafer is heated to the final annealing temperature, while the bulk of the wafer remains close to the relatively cooler intermediate temperature. In this embodiment, this second stage is achieved by exposing the top-side surface to a high-power flash from the irradiance system 180, for a relatively short duration, on the order of one millisecond, for example. The cooler bulk of the wafer then acts as a heat sink to facilitate rapid cooling of the top-side surface.

In order to ensure adequate thermal processing of such wafers, and to achieve consistent and repeatable thermal processing of similar wafers successively processed in the chamber 130, in this embodiment, the device side temperature is monitored during the second stage, i.e., during the rapid irradiance flash, in real-time, as discussed in greater detail herein.

Substrate Side Pre-Heating Device

In the present embodiment, the arc lamp 152 is a 500 kW water wall argon plasma arc lamp manufactured by Mattson Technology Canada, Inc. of Vancouver, Canada. Examples of such arc lamps are disclosed in commonly-owned U.S. Pat. Nos. 4,700,102, 4,937,490 and 6,621,199, which are incorporated herein by reference. Such arc lamps provide numerous advantages for semiconductor annealing as compared to tungsten filament lamp sources, as discussed in the above-mentioned U.S. Patents. For larger temperature increases, multiple arc lamps may be substituted for the single arc lamp 152. Alternatively, however, other types of pre-heating devices, including flash lamps and even tungsten filament lamp sources or arrays of such lamp sources, for example, may be substituted.

RTP System Computer (RSC)

Figure 2:
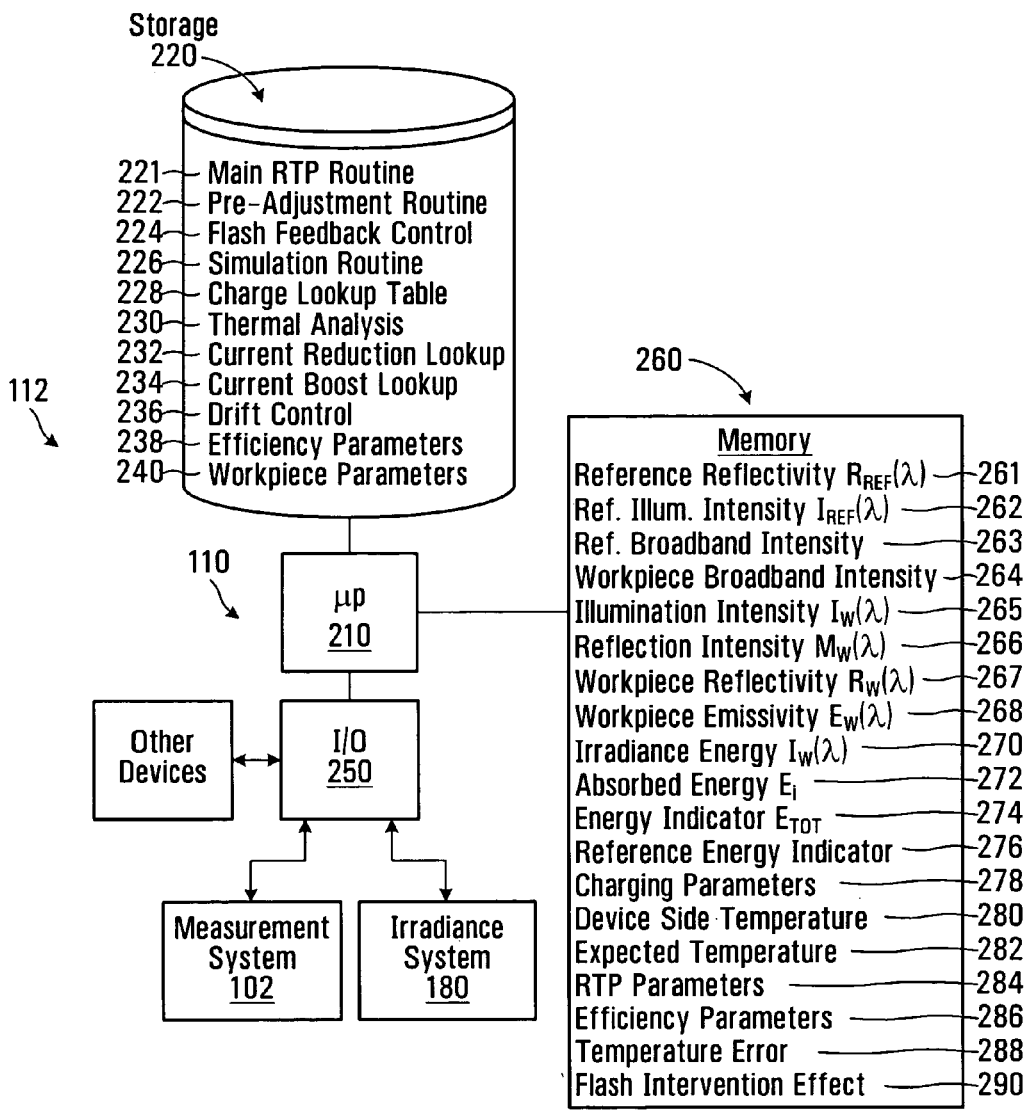
FIG. 2 is a block diagram of a rapid thermal processing system computer (RSC) of the system shown in FIG. 1.

Referring to FIGS. 1 and 2, the RTP System Computer (RSC) 112 is shown in greater detail in FIG. 2. In this embodiment, the RSC includes the processor circuit 110, which in the present embodiment includes a microprocessor 210. More generally, however, in this specification, the term "processor circuit" is intended to broadly encompass any type of device or combination of devices capable of performing the functions described herein, including (without limitation) other types of microprocessors, microcontrollers, other integrated circuits, other types of circuits or combinations of circuits, logic gates or gate arrays, or programmable devices of any sort, for example, either alone or in combination with other such devices located at the same location or remotely from each other, for example. Additional types of processor circuits will be apparent to those ordinarily skilled in the art upon review of this specification, and substitution of any such other types of processor circuits is considered not to depart from the scope of the present invention.

In the present embodiment, the microprocessor 210 is in communication with a storage device 220, which in this embodiment includes a hard disk drive. The storage device 220 is used to store a plurality of routines that configure or program the microprocessor 210 to perform various functions described herein, including a main rapid thermal processing (RTP) routine 221, a pre-adjustment routine 222, a flash feedback control routine 224, a simulation routine 226, a thermal analysis routine 230, and a drift control routine 236, and may also store additional routines (not shown) if desired. In this embodiment, the storage device 220 may also be used to store various types of data received or used by the microprocessor 210, such as a charge look-up table 228, a current reduction look-up table 232, a current boost look-up table 234 and a workpiece parameters store 240, for example.

In the present embodiment, the microprocessor 210 is also in communication with a memory device 260, which in this embodiment includes a random access memory (RAM). In this embodiment, the various routines stored in the storage device 220 configure the microprocessor 210 to define various registers or stores in the RAM for storing various properties or parameters measured, calculated or used by the microprocessor 210, including a reference reflectivity store 261, a reference illumination intensity store 262, a reference broadband intensity register 263, a workpiece broadband intensity register 264, a workpiece illumination intensity store 265, a measured reflection intensity store 266, a workpiece reflectivity store 267, a workpiece emissivity store 268, an irradiance energy store 270, an absorbed energy store 272, an energy indicator register 274, a reference energy indicator register 276, a charging parameters store 278, a device side temperature store 280, an expected temperature store 282, an RTP parameters store 284, an efficiency parameters store 286, a temperature error register 288 and a flash intervention effect register 290, as well as other stores and/or registers (not shown).

The microprocessor 210 of the present embodiment is in further communication with an input/output (I/O) interface 250, for communicating with various devices of the system 100 shown in FIG. 1, including the measurement system 102 and the irradiance system 180, as well as other system components such as the pre-heating device 150, the diagnostic illumination source 160, the imaging device 162, the fast radiometer 164, and various user input/output devices (not shown) such as a keyboard, a mouse, a monitor, one or more disk drives such as a CD-RW drive and a floppy diskette drive, and a printer, for example. In this embodiment, the I/O interface 250 includes an optical-electrical converter, for communicating with at least some of these devices (such as the fast radiometer 164 and the measurement system 102, for example) via a fiber optic network (not shown). In this regard, it will be appreciated that such optical communications avoid difficulties posed by electromagnetic interference and electrical noise resulting from large electric currents and sudden electrical discharges required by the pre-heating device 150 and the irradiance system 180.

Device Side Irradiance System

Referring back to FIG. 1, generally, the irradiance system 180 is operable to irradiate the surface 104 of the workpiece 106, which in this embodiment is the device side 122 of the wafer 120. In this embodiment, the irradiance system 180 includes the flash lamps 182, 183, 185 and 187 and the reflector system 184 shown in FIG. 1. More particularly, in this embodiment each of the flash lamps 182 includes a liquid-cooled flash lamp manufactured by Mattson Technology Canada, Inc. of Vancouver, Canada, similar to those described in commonly-owned United States patent application publication No. US 2005/0179354 and PCT publication No. WO 2005/078762, both of which are hereby incorporated herein by reference. In this regard, it has been found that this particular type of flash-lamp provides numerous advantages over more conventional flash-lamps, including improved consistency and repeatability of thermal processing, for example. Alternatively, other types of flash lamps may be substituted. Or as a further alternative, other types of irradiance devices, such as microwave flash or microwave pulse generators for example, may be substituted for the flash lamps. More generally, other heating devices may be substituted for the irradiance system 180 if desired.

In the present embodiment, the irradiance system 180 is operable to expose the device side 122 to an irradiance flash having a duration less than a thermal conduction time of the wafer 120. In the present embodiment, the thermal conduction time of the wafer is on the order of 10 to 15 ms. Accordingly, in the present embodiment, the irradiance system 180 is operable to produce the irradiance flash to have a duration on the order of 10 milliseconds or less. More particularly, in this embodiment the irradiance system is operable to produce the irradiance flash to have a duration on the order of 1 millisecond.

To achieve this, in the present embodiment, the irradiance system 180 further includes the power supply system 188 shown in FIG. 1. More particularly, in this embodiment each of the electrical power supply systems 189, 191, 193 and 195 of the power supply system 188 acts as a power supply system for a respective one of the flash lamps 182, 183, 185 and 187, and includes a pulsed discharge unit that may be pre-charged then abruptly discharged in order to supply a "spike" of input power to the respective flash lamp to produce the desired irradiance flash. More particularly still, in the present embodiment, each of the pulsed discharge units includes a pair of 7.9 mF capacitors (not shown) (15.8 mF per pulsed discharge unit), capable of being charged at 3500 V to store up to 96.775 kJ of electrical energy, and capable of discharging such stored energy to its respective flash lamp within a short period of time, such as 0.5 to 1.5 ms, for example. Thus, in this embodiment the irradiance system 180 is capable of storing up to 387.1 kJ of electrical energy, and is capable of discharging such energy through the flash lamps 182, 183, 185 and 187 in a flash on the order of one millisecond in duration. Alternatively, larger or smaller power supplies, or other types of power supplies, may be substituted.

In this embodiment, each of the electrical power supply systems 189, 191, 193 and 195 includes a power control circuit in communication with the pulsed discharge unit and the respective flash lamp, for feedback control of the pulsed discharge that produces the irradiance flash, as discussed below. Alternatively, a plurality of flash lamps may be powered by a single electrical power supply system and/or by a single power control circuit, if desired. Or, as a further alternative, a single flash lamp with a single electrical power supply system and control circuit may be substituted.

Power Control Circuit

Figure 3:
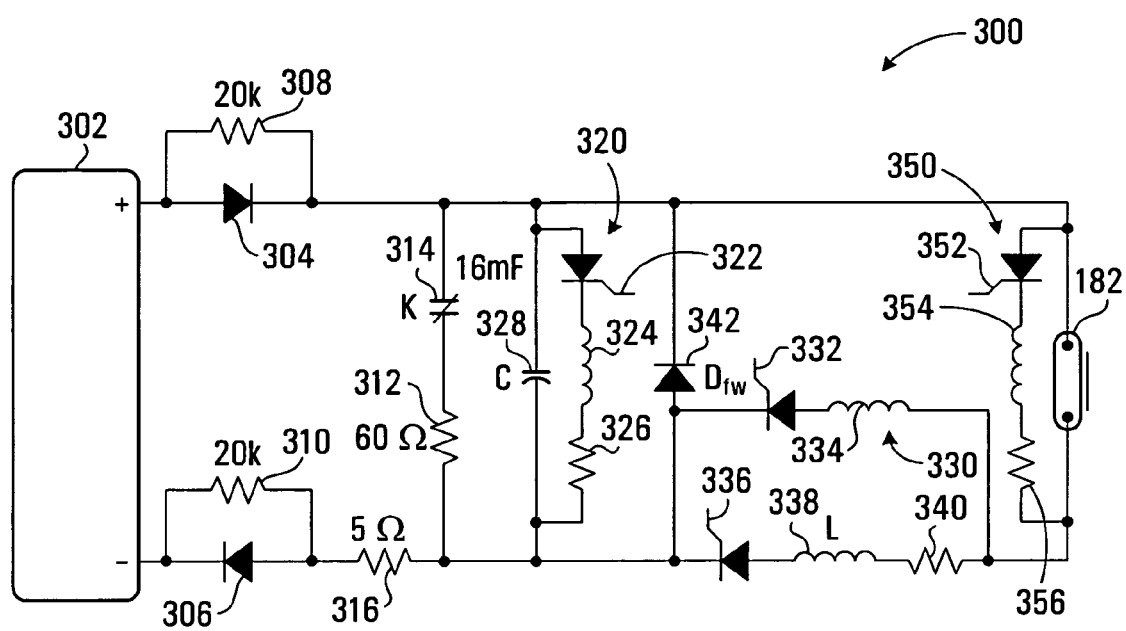
FIG. 3 is a circuit diagram of a power control circuit of the system shown in FIG. 1.

Referring to FIGS. 1 and 3, an exemplary power control circuit is shown generally at 300 in FIG. 3. In this embodiment, each of the individual electrical power supply systems 189, 191, 193 and 195 of the power supply system 188 includes a power control circuit such as that shown at 300, in communication with its respective flash lamp 182, 183, 185 or 187. Alternatively, if desired, a single power control circuit may be substituted, either in combination with a single common power supply or multiple power supplies, and likewise in combination with either a single flash lamp or multiple flash lamps. As a further alternative, other types of power control circuits may be substituted.

In this embodiment, the power control circuit 300 is in electrical communication with a power supply unit 302 and with a flash lamp, which in this example is the flash lamp 182. In this embodiment, the power supply unit 302 is in communication with the processor circuit 110, and can be controlled by the processor circuit to produce an adjustable DC voltage of up to 3500 V for charging a capacitor bank 328. In this embodiment, the capacitor bank 328 includes two 7.9 mF capacitors in parallel, which provides an effective capacitance of 15.8 mF. Thus, when charged at 3500 V, the capacitor bank 328 stores 96.775 kJ of electrical energy.

In this embodiment, the power control circuit 300 includes first and second diodes 304 and 306 and first and second resistors 308 and 310, which in this embodiment are 20 kΩ resistors. In the present embodiment, the power control circuit 300 further includes a resistor 312, a dump relay 314 and a further resistor 316. In this embodiment the resistor 312 includes a 60Ω resistor, while the resistor 316 includes a 5Ω resistor. In the present embodiment, the dump relay 314 is used to safely discharge the capacitor bank through the resistor 312 in circumstances where for safety the capacitor bank must be discharged.

In this embodiment, the power control circuit 300 includes a first power reduction circuit shown generally at 320, and a power boost circuit shown generally at 330. Generally, in this embodiment the power reduction circuit 320 is configured to reduce the power output of the flash lamp 182 by reducing the amount of electric current supplied to the flash lamp, in response to a control signal received from the processor circuit 110. Conversely, in this embodiment the power boost circuit 330 is configured to increase the peak power output of the flash lamp 182 by increasing the amount of electric current supplied to the flash lamp, in response to a control signal received from the processor circuit 110.

In this embodiment, the power reduction circuit 320 includes a crowbar circuit in communication with a source of the irradiance flash and an electrical power supply of the source. More particularly, in this embodiment the crowbar circuit is connected in parallel with the capacitor bank 328. More particularly still, in this embodiment the crowbar circuit (i.e., the power reduction circuit 320) includes a switching circuit, an inductor 324 and a resistor 326. In the present embodiment, the switching circuit includes a single switch element, which in this embodiment is a semiconductor switch. More particularly, in this embodiment the semiconductor switch is a thyristor or silicon-controlled rectifier 322, whose gate is in communication with the processor circuit 110. In this embodiment, the inductor 324 and the resistor 326 have an inductance of 5.2 μH and a resistance of 39 mΩ respectively.

In this embodiment, the thyristor 322 of the power reduction circuit 320 remains in a non-conducting state until a control signal is received from the processor circuit 110 at a gate of the thyristor 322, to place it in a conducting state, thereby reducing the electric current being supplied to the flash lamp 182, as described in greater detail below.

In the present embodiment, the power boost circuit 330 includes an inductive crowbar circuit in communication with a source of the irradiance flash (in this embodiment the flash lamp 182) and an electrical power supply of the source (in this embodiment the capacitor bank 328). More particularly, in the present embodiment, the power boost circuit 330 includes a thyristor 332 and an inductor 334, which in this embodiment has an inductance of 1.5 μH.

In this embodiment, the power control circuit 300 further includes a thyristor 336, an inductor 338, a resistor 340 and a free-wheeling diode 342. In this embodiment, the resistor 340 has a resistance of 5 mΩ, and the inductor 338 has an inductance of 4.7 μH, which is greater than the 1.5 μH inductance of the inductor 334 of the power boost circuit 330.

In this embodiment, the control gates of the thyristor 336 and the thyristor 332 are both in communication with the processor circuit 110, and are each in a non-conducting state until a gate voltage is applied by the processor circuit 110.

As discussed in greater detail below, the processor circuit 110 commences an irradiance flash by applying a gate voltage to the thyristor 336, to allow the capacitor bank 328 to begin to discharge through the flash lamp 182, the resistor 340 and the inductor 338. Thus, as the flash commences and the arc current increases toward its peak, a self-induced electromotive force (emf) ($\epsilon = -L(di/dt)$) arises in the inductor, to oppose the increasing current, so that the rate of increase of the electric current being discharged through the flash lamp 182 is effectively limited by the 4.7 μH inductor 338. If a power boost is desired, the processor circuit 110 applies a gate voltage to the thyristor 332 to place it in a conducting state, which allows electric current to flow through the 1.5 μH inductor 334, whose self-induced emf (which opposes the increase in current) is less than the self-induced emf of the inductor 338 due to its lower inductance, thereby reducing the overall current-limiting effect of these components of the power control circuit, and allowing the arc current to rise more quickly to a higher peak. In the present embodiment, firing the thyristor 332 at an appropriate time effectively boosts the peak electric current supplied to the flash lamp 182, thereby effectively boosting the peak temperature of the surface 104 of the workpiece 106 upon which the irradiance flash from the flash lamp 182 is incident, although the current (and hence the power of the irradiance flash) tends to drop off slightly faster than if the thyristor 332 had not been fired.

In the present embodiment, the power control circuit 300 further includes a second power reduction circuit shown generally at 350 in FIG. 3. Generally, in this embodiment the second power reduction circuit 350 is configured to reduce the power output of the flash lamp 182 by reducing the amount of electric current supplied to the flash lamp, in response to a control signal received from the processor circuit 110. In this embodiment, the second power reduction circuit 350 is similar to the first power reduction circuit 320, and includes a crowbar circuit in communication with a source of the irradiance flash and an electrical power supply of the source. Unlike the first power reduction circuit, however, in this embodiment the second power reduction circuit 350 is connected in parallel with the flash lamp 182 rather than with the capacitor bank 328. More particularly, in this embodiment the second power reduction circuit 350 includes a switching circuit, an inductor 354 and a resistor 356. In the present embodiment, the switching circuit includes a single switch element, which in this embodiment is a semiconductor switch. More particularly, in this embodiment the semiconductor switch is a thyristor or silicon-controlled rectifier 352, whose gate is in communication with the processor circuit 110. In this embodiment, the inductor 354 and the resistor 356 have an inductance of 5.2 µH and a resistance of 39 mµ, respectively.

In this embodiment, the thyristor 352 of the second power reduction circuit 350 remains in a non-conducting state until a control signal is received from the processor circuit 110 at a gate of the thyristor 352, to place it in a conducting state, thereby reducing the electric current being supplied to the flash lamp 182, as described in greater detail below.

First Measurement System (for Flash Feedback Control and Drift Control)

Figure 4:
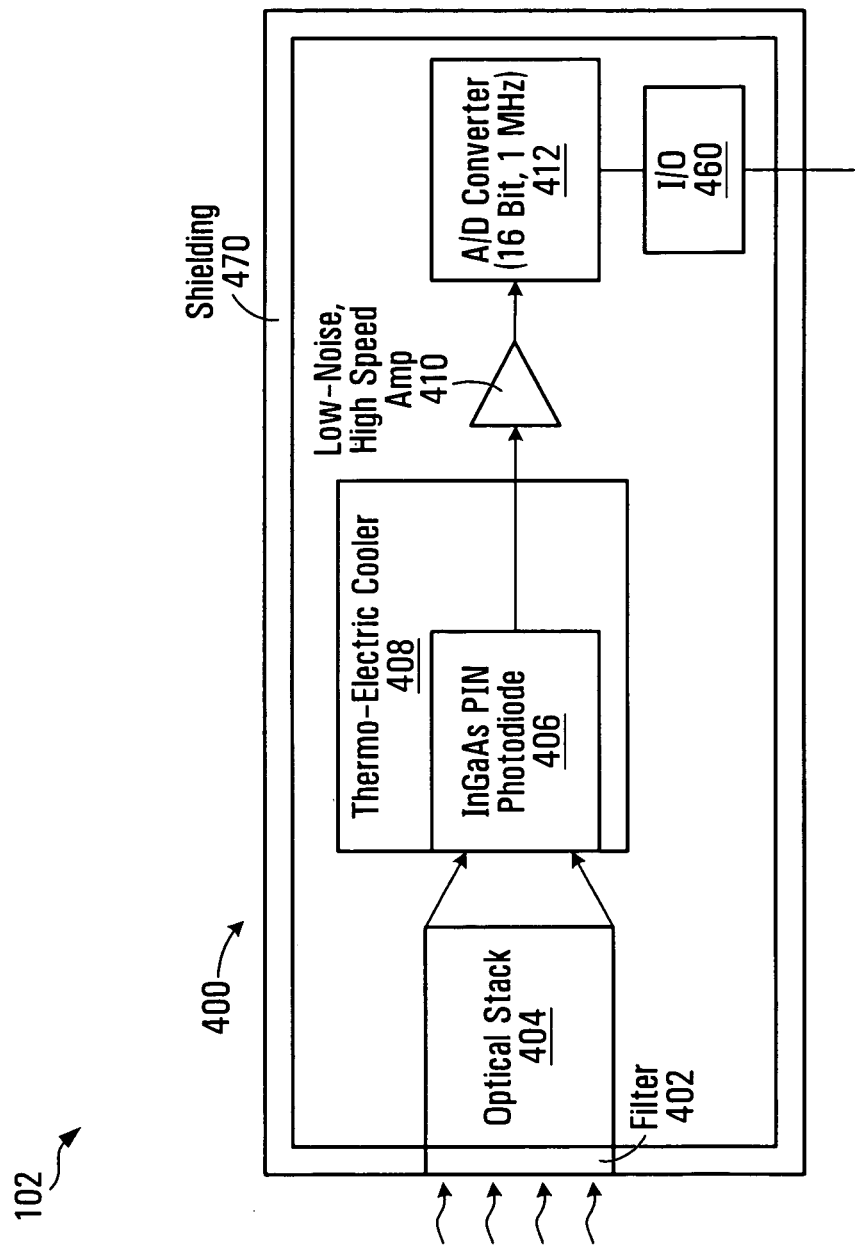
FIG. 4 is a block diagram of an ultra-fast radiometer of the system shown in FIG. 1.

Referring to FIGS. 1 and 4, the measurement system is shown generally at 102 in FIG. 4. In this embodiment, the measurement system 102 includes an ultra-fast radiometer 400 generally similar to that disclosed in commonly-owned PCT Publication No. WO 03/060447, designed to have a wide dynamic range and ultra-fast time response. Thus, in this embodiment the ultra-fast radiometer 400 includes a 1450 nm narrow-band filter 402, an optical stack 404, a high-speed InGaAs PIN photodiode 406, an integrated thermoelectric cooler 408 for controlling the temperature of the photodiode 406 to within 20 milliKelvins, an amplifier 410 and an analog-to-digital (A/D) converter 412.

In this embodiment, the amplifier 410 includes a very low noise, high-speed, differential transimpedance amplifier, having a 3 dB electrical bandwidth of 500 kHz. The amplifier 410 conditions and amplifies the photodiode output signal, and supplies the amplified signal to the A/D converter 412. The A/D converter 412 produces 16-bit samples of the amplified photodiode signal, at a sampling rate of 1 MHz.

In this embodiment, the A/D converter 412 is in communication with the processor circuit 110 of the RSC 112, via an input/output (I/O) interface 460. In this embodiment, the I/O interface 460 includes an optical-electrical converter, to enable such communications signals to be transmitted and received over the fiber optic network (not shown), thereby avoiding deleterious effects of electromagnetic interference and electrical noise, which may be significant in the temporal vicinity of the flash. In this embodiment, most measurement-related calculations are performed by the processor circuit 110 rather than by on-board circuitry of the measurement system 102. Alternatively, however, such measurement-related calculations may be performed by an optional on-board processor circuit (not shown) of the measurement system 102, or more generally, by any other local or remote processor circuit or combination of processor circuits.

In this embodiment, the ultra-fast radiometer 400 further includes shielding 470, to reduce the influence of such interference on the various internal components of the ultra-fast radiometer.

If desired, the ultra-fast radiometer 400 may also include an internal reference device 450, which may be thermally controlled and highly stable, and which may be used to produce calibration and reference signals. In such an embodiment, the radiometer 400 may also include on-board circuitry for adjusting the 16-bit samples received from the A/D converter 412 in response to such calibration and reference signals, in order to dynamically compensate for any unpredictable drift that may occur in the various electronic components of the ultra-fast radiometer.

Referring back to FIG. 1, in this embodiment, the measurement system 102, or more particularly the ultra-fast radiometer 400, is configured to measure the present temperature of the first surface 104 of the workpiece 106 (or more particularly, of the device side 122 of the wafer 120). In this embodiment, the system 100 effectively includes a filtering device, or more particularly, the water-cooled window 186, which in this embodiment is interposed between the first surface 104 and the irradiance system 180. In this regard, the water-cooled window 186 serves to transmit most of the radiation produced by the flash lamps 182, 183, 185 and 187 to the first surface 104 of the workpiece 106 (in this embodiment, the device side 122 of the wafer 120) to heat the device side, while at the same time absorbing radiation at a wavelength of 1450 nm. Conversely, due to the effects of the 1450 nm narrow-band filter 402, the ultra-fast radiometer is responsive only to radiation in the immediate vicinity of 1450 nm. Therefore, the ultra-fast radiometer detects only thermal emissions from the surface 104 (the device side 122), and does not detect any radiation produced by the irradiance system and reflected by the surface 104. The water-cooled window 186 also serves to absorb most of the radiation at wavelengths thermally emitted by the device side 122 (typically 1400 nm and longer), thereby preventing such wavelengths from being reflected back to the wafer which would tend to cause undesirable and non-uniform heating of the device side at inopportune times when cooling is desired. (The ultra-fast radiometer may, however, detect a small amount of "chamber return", i.e., a small percentage of the radiation thermally emitted by the device side at the diagnostic wavelength may be reflected by the lower quartz pane of the window 186 back to the device side, which may re-reflect a small portion of such reflected thermal emissions to the radiometer. Chamber return may be taken into account, if desired, by employing methods similar to those disclosed in commonly-owned PCT Publication No. WO 03/060447, for example, or any other suitable method.)

Second Measurement System (for Flash Pre-Adjustment Measurements)

Figure 5:
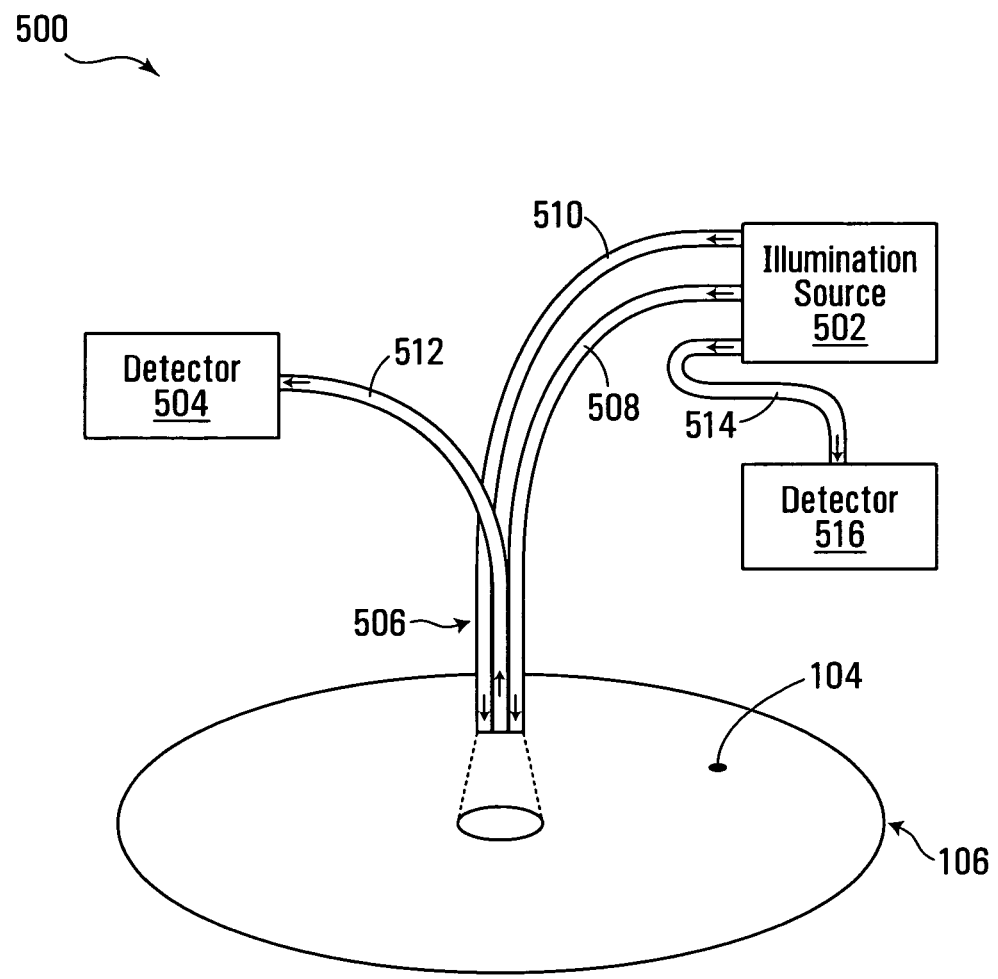
FIG. 5 is a representation of a second measurement system of the system shown in FIG. 1.

Referring to FIGS. 1 and 5, a second measurement system is shown generally at 500 in FIG. 5. In this embodiment, the second measurement system 500 is used to obtain an initial measurement of a heating parameter of the surface 104 of the workpiece 106, before the surface 104 is subjected to the irradiance flash.

In this embodiment, a future irradiance flash to be incident upon a first surface of a first workpiece is pre-adjusted, contemporaneously with an incidence of a present irradiance flash upon a similar surface of a second workpiece. More particularly, in this embodiment, the second measurement system 500 is disposed outside the chamber 130 shown in FIG. 1, and thus, in the present embodiment, the heating parameter of the surface 104 is measured before the workpiece 106 is loaded into the chamber 130 for rapid thermal processing. Thus, the heating parameter of the surface 104 of one workpiece may be measured outside the chamber 130 while a second wafer is being thermally processed within the chamber, without slowing down the throughput of the chamber 130. Alternatively, the second measurement system or a variation thereof may be disposed inside the chamber 130 for in situ measurement of the surface 104, if desired.

In the present embodiment, the heating parameter to be measured by the second measurement system 500 includes an emissivity of the surface 104, which in this embodiment is measured indirectly, by measuring the reflectivity of the surface. In this regard, the emissivity $\epsilon_W$, reflectivity $R_W$ and transmissivity $T_W$ of the workpiece 106 at a given wavelength satisfy the relation $\epsilon_W(\lambda)=1-R_W(\lambda)-T_W(\lambda)$. In this embodiment, in which the workpiece is a silicon wafer, when the wafer is cold (e.g., room temperature), the wafer will not be completely opaque to all wavelengths of the irradiance flash, and thus, its transmissivity $T_W(\lambda)$ will be non-zero for at least some wavelengths. However, in the present embodiment, the use of arc lamps to produce the irradiance flash tends to minimize transmissivity effects, as over 95% of the radiant energy produced by such arc lamps is below the 1.2 µm band gap absorption of cold silicon, compared with only 40% for a typical tungsten source, for example. Thus, when measured in the spectrum of the irradiance flash, the transmissivity of the workpiece is negligible at most relevant wavelengths. For the purpose of pre-adjusting the irradiance flash, transmissivity may be ignored in the present embodiment, and the emissivity may thus be approximated as $\epsilon_W(\lambda)=1R_W(\lambda)$. Thus, the heating parameter of interest, namely, the emissivity $\epsilon_W(\lambda)$ of the surface 104, may be measured indirectly, by measuring the reflectivity $R_W(\lambda)$ of the surface. Alternatively, the heating parameter may be viewed as a reflectivity of the surface 104, which in this embodiment is measured directly.

In this embodiment, the second measurement system 500 includes an illumination source 502, a detector 504, a probe 506 and a second detector 516. More particularly, in this embodiment the probe 506 is an optical fiber probe, comprising two optical fibers 508 and 510 in optical communication with the illumination source 502, an optical fiber 512 in communication with the detector 504, and an optical fiber 514 in communication with the second detector 516. Alternatively, other numbers of optical fibers may be substituted. More generally, other types of measurement systems may be substituted.

In this embodiment, the illumination source 502 includes a deuterium-halogen light source. In this regard, such a light source has been found to include appreciable intensities at wavelengths corresponding to those of the irradiance flash produced by the irradiance system 180, including ultraviolet, visible and infrared wavelengths.

Alternatively, however, the illumination source may include a low intensity arc lamp (whose intensity is "low" relative to the high intensity flash lamp used to produce the irradiance flash). For example, the illumination source 502 may include a low-intensity arc lamp with a sufficiently low optical output power to avoid prematurely heating the surface 104 to a high temperature. The low-intensity arc lamp may include either a continuous-wave (DC) arc lamp, or a flash lamp, such as a xenon flash lamp, for example. If desired, the illumination source 502 may be provided with a filter configured to simulate an irradiance spectrum of the high-intensity flash lamp(s) used to produce the irradiance flash. Such a filter may allow the illumination source 502 to simulate the output spectrum of the irradiance system 180, albeit at a much lower overall power. For example, where the illumination source is a xenon flash lamp, an envelope of the low intensity xenon flash lamp may be provided with an interference filter to achieve such an effect. Alternatively, other types of illumination sources may be substituted.

Or, as a further alternative, a separate illumination source may be omitted. For example, in some embodiments the detector 504 may include its own illumination source. Alternatively, if desired, illuminating the surface 104 may include directing a portion of a present irradiance flash incident upon another workpiece to the surface 104 of the workpiece 106. For example, the optical fibers 508 and 512 may be in optical communication with the chamber 130, so that a small portion of the irradiance flash used to heat the surface 104 of a first workpiece inside the chamber 130 may be diverted outside the chamber to illuminate the surface 104 of a second workpiece outside the chamber 130, which will subsequently be processed in the chamber 130 after processing of the first workpiece has been completed. In such an embodiment, the irradiance diverted from the chamber 130 to illuminate the surface 104 of the second workpiece may be filtered or may be spread over a larger surface area by one or more lenses, to effectively reduce its intensity upon the surface 104.

In this embodiment, the detector 504 includes a spectrometer. More particularly, in this embodiment the detector includes a model PS001 Spectrometer, manufactured by Photon Control Inc. of Burnaby, BC, Canada. In the present embodiment, the detector 504 is operable to measure reflectivity of the surface 104 of the workpiece 106 over a wavelength spectrum corresponding to the irradiance flash to which the surface 104 will be subjected. More particularly, in this embodiment the wavelength spectrum ranges from 180 nm to 1400 nm, and the spectrometer is operable to measure the reflectivity $R(\lambda)$ at a plurality of discrete wavelengths within the 180 nm to 1400 nm range. More particularly still, in this embodiment the wavelength spectrum includes 2048 discrete wavelengths $\lambda=\{\lambda_0, \lambda_1, \lambda_2, \ldots \lambda_{2047}\}$, evenly spaced across the 180 nm to 1400 nm range. Alternatively, however, the boundaries of the spectrum may be varied, if desired. For example, in some embodiments, a portion of the spectrum at wavelengths longer than 1100 nm may be disregarded, due to the comparatively small amounts of energy produced by the irradiance system 180 at such wavelengths. Similarly, the number of discrete wavelengths within the spectrum may also be varied, to include a larger or a smaller number of discrete wavelengths, as desired. Thus, for the sake of generality, in this embodiment the 2048 discrete wavelengths are referred to herein as $\lambda=\{\lambda_1, \lambda_2, \ldots \lambda_N\}$.

Alternatively, if desired, the detector 504 may be operable to produce a single reflectivity value, such as a broadband reflectivity value over a substantial portion of the wavelength spectrum of the irradiance flash, for example. Such a single reflectivity value may be employed in embodiments in which the illumination source 502 simulates the wavelength spectrum of the irradiance system 180, or where irradiance from the irradiance system 180 is used to illuminate the surface 104 for the purpose of the reflectivity measurement, as mentioned above, for example.

In the present embodiment, the second detector 516 includes a broadband radiation detector. The second detector 516 receives electromagnetic radiation from the illumination source 502 via the optical fiber 514, and produces a single data value representing the broadband intensity across the entire spectrum of interest of the electromagnetic radiation from the illumination source 502.

In this embodiment, the processor circuit 110 of the RSC 112 is in communication with the second measurement system 500, or more particularly with the illumination source 502 and the detector 504, via the fiber optic network (not shown).

Operation—Overview

In this embodiment, several approaches are used in combination to improve consistency and repeatability of rapid thermal processing cycles.

In a first approach, a heating effect of an irradiance flash to be incident on the surface 104 of the workpiece 106 is predicted, in response to a measurement of a heating parameter of the surface 104. The irradiance flash is then pre-adjusted, prior to its commencement, in response to the predicted heating effect. Thus, for example, the heating parameter may include emissivity of the surface 104 of the workpiece 106, and if two ostensibly identical workpieces in fact have slightly different emissivities, the energy output of the irradiance flash may be pre-adjusted to compensate for the different percentages of the irradiance flash that will be absorbed by the surfaces of the two workpieces.

In a second approach, a temperature of the surface 104 of the workpiece 106 is measured during an initial portion of the irradiance flash incident on the surface 104. A power of a remaining portion of the irradiance flash is controlled, in response to the temperature. Thus, for example, if real-time measurements of the temperature of the surface 104 during the initial portion of the irradiance flash (such as during the first 0.3 to 0.5 ms of the flash, for example) indicate that the surface 104 is being heated more quickly or less quickly than desired, the power of the remaining portion of the flash may be reduced or increased, to cause the temperature of the surface 104 to more closely follow a desired temperature trajectory.

In a third approach, at least one thermal efficiency parameter associated with the irradiance system 180 is monitored, and in response, control information used by the irradiance system to produce the irradiance flash is automatically updated. In this regard, it is possible that the thermal efficiency of the system 100 may decrease over time, due to contamination or deterioration of flash lamp components such as electrodes, envelopes or coolants, for example, or of the window 186 or other components of the system 100; conversely, it is possible that the thermal efficiency of the system may increase, for example, if deteriorated electrodes or other components are replaced, or if contaminated coolants or windows are cleaned or replaced, for example. Thus, in this embodiment, the control information used to produce the irradiance flash is automatically updated, to compensate for such changes in thermal efficiency of the system.

In a fourth approach, an electrical pulse having a fall time less than its rise time is supplied to an irradiance device (or more particularly, to the flash lamps 182, 183, 185 and 187 in the present embodiment), to produce the irradiance flash incident on the surface 104 of the workpiece 106.

Although all of these approaches may be adopted in combination in a particular embodiment, in illustrative alternative embodiments, any one of these approaches may be adopted without necessarily adopting any or all of the remaining approaches. A combination of all of these approaches tends to minimize errors and maximize reproducibility, although subcombinations of one or more of these approaches may suffice for applications that do not require extreme reproducibility.

Main Rapid Thermal Processing Routine—Overview

Referring to FIGS. 1 and 2, in this embodiment the main RTP routine 221 directs the processor circuit 110 to control the system 100 to subject the workpiece 106 to a desired thermal cycle. To achieve this, in the present embodiment the main RTP routine 221 directs the processor circuit 110 to receive and store user-specified parameters defining the desired thermal cycle, which may be input by a user using a user input device (not shown) such as a keyboard, for example. More particularly, in this embodiment the user-specified parameters include a unique workpiece type identifier $W_{ID}$, a desired intermediate temperature $T_{INT}$ to which the entire workpiece 106 is to be heated immediately prior to the commencement of the irradiance flash, and a desired temperature jump $\Delta T$ to which only the surface 104 of the workpiece 106 is to be heated, while the bulk of the workpiece remains substantially at or near the intermediate temperature $T_{INT}$. The processor circuit 110 is directed to store the user-specified parameters in the RTP parameters store 284.

In this embodiment, the workpiece type identifier $W_{ID}$ identifies a specific one of a plurality of different types of workpieces that have been pre-characterized for thermal processing by the system 100. More particularly, in this embodiment the workpiece parameters store 240 includes pre-defined thermal processing parameters for each of these different types of pre-characterized workpieces. More particularly still, in the present embodiment the relationship between the user-specified temperature jump $\Delta T$ and the corresponding amount of electrical charge to be stored in the power supply system 188 may be approximated as $\Delta T = S_{TE} * \ln(E_{CH}) + O_{TE}$. Thus, in this embodiment the workpiece parameters store 240 stores a plurality of workpiece characterization records, each such record including a field storing the unique workpiece type identifier $W_{ID}$, respective fields storing the predetermined characterizing values $S_{TE}$ and $O_{TE}$ for that type of workpiece, and a further field storing an efficiency value $C_{TE}$ representing the efficiency of the system 100 at the time the characterizing values $S_{TE}$ and $O_{TE}$ were generated and stored for that workpiece type. In this embodiment, each record in the workpiece parameters store 240 further includes a field for storing a reference energy indicator value $E_{REF}$ corresponding to the particular workpiece type, as discussed in greater detail below in connection with the pre-adjustment routine 222. Alternatively, although a logarithmic relationship between temperature jump and electrical charge is consistent with empirical observations for the purposes of the present embodiment, other suitable approximations or functional relationships may be substituted, and other corresponding characterizing values may be stored. For example, the specified intermediate temperature $T_{INT}$ may also be taken into account in defining the relationship between the specified temperature jump $\Delta T$ and the required electrical charge $E_{CH}$ to achieve that jump. Likewise, the tendency of greater electrical charges to produce more irradiance at ultraviolet wavelengths, which silicon tends to reflect rather than absorb, may also be taken into account in a given functional relationship if desired.

In this embodiment, the main RTP routine 221 directs the processor circuit 110 to use the workpiece type identifier $W_{ID}$ stored in the RTP parameters store 284 to locate and address the corresponding record in the workpiece parameters store 240. The processor circuit 110 is then directed to use the located characterizing values $S_{TE}$ and $O_{TE}$ and the specified temperature jump $\Delta T$ to calculate a corresponding amount of electrical energy $E_{CHN}$ to be stored in the power supply system 188 (or more particularly, in the capacitor banks thereof) to produce the desired irradiance flash:

$$E_{CHN} = e^{\left(\frac{\Delta T - O_{TE}}{S_{TE}}\right)}$$

Alternatively, parameters other than $W_{ID}$, $T_{INT}$ and $\Delta T$ may be used to define the desired thermal cycle. For example, if the workpiece to be processed is not one of the pre-characterized wafer types, the identifier $W_{ID}$ may be omitted. In such a case, the user-specified parameters may include the desired intermediate temperature $T_{INT}$ and a desired amount of electrical energy $E_{CHN}$ to be stored in the power supply system 188 to produce the irradiance flash. Alternatively, for such an un-characterized wafer type, the desired intermediate temperature $T_{INT}$ and desired temperature jump $\Delta T$ may be specified, and the processor circuit may determine the desired electrical energy and voltage with reference to a default workpiece type, with any emissivity differences between the default workpiece type and the actual workpiece 106 to be compensated for by execution of the pre-adjustment routine 222, as discussed in greater detail below.

In this embodiment, the stored charge value $E_{CHN}$ is then adjusted to compensate for any drift in system efficiency that may have occurred since the characterizing values $S_{TE}$ and $O_{TE}$ were generated for the present workpiece type. To achieve this, in this embodiment the main RTP routine 221 directs the processor circuit 110 to adjust the charging energy $E_{CHN}$ in response to the efficiency value $C_{TE}$ from the currently addressed record in the workpiece parameters store 240 representing the efficiency of the system 100 at the time the record was generated, and a present system efficiency value $C_{eff(N)}$ representing the present efficiency of the system 100. In this embodiment, the latter present efficiency value $C_{eff(N)}$ is stored in the efficiency parameters stores 238 and 286, as discussed in greater detail below in connection with the drift control routine 236 ("Stage 3"). Thus, the main RTP routine 221 directs the processor circuit 110 to calculate an efficiency-adjusted electrical energy value, $$E_{ADJ} = E_{CHN}\left(\frac{C_{TE}}{C_{eff(N)}}\right)$$

The main RTP routine 221 directs the processor circuit 110 to store this adjusted electrical energy value $E_{ADJ}$ in the charging parameters store 278. Alternatively, drift correction may be omitted, if desired.

In this embodiment, the processor circuit 110 is also directed to store a corresponding capacitor charging voltage value V in the charging parameters store 278, representing a voltage at which the capacitor banks of the individual electrical power supply systems 189, 191, 193 and 195 are to be charged to store the desired amount of electrical energy $E_{ADJ}$. This voltage V may be calculated by dividing the efficiency-adjusted energy $E_{ADJ}$ by the number of flash lamps and assuming that the capacitor banks for each flash lamp are ideal capacitors for which $E=0.5CV^2$, i.e., $V=(2E/C)^{0.5}$. Alternatively, to compensate for any non-ideal aspects of the capacitor banks, the charging voltage may be determined from the efficiency-adjusted energy value by using the latter value $E_{ADJ}$ to address the charge look-up table 228 to locate a corresponding charging voltage V.

In the present embodiment, prior to commencement of the thermal cycle, the main RTP routine 221 directs the processor circuit 110 to execute the pre-adjustment routine 222. As discussed in greater detail below ("Stage 1"), the pre-adjustment routine 222 directs the processor circuit to measure the emissivity of the actual workpiece 106 that is to be processed, to compensate for any possible differences in emissivity between the workpiece 106 and the emissivity of the workpiece that was used to produce the record for that type of workpiece stored in the workpiece parameters store 240. Further adjustments to the charging energy $E_{ADJ}$ and voltage V stored in the charging parameters store 278 may be made if appropriate, as discussed in greater detail below in connection with the pre-adjustment routine 222.

Following execution of the pre-adjustment routine 222, the main RTP routine 221 directs the processor circuit 110 to control the system 100 to carry out the thermal cycle.

More particularly, in this embodiment the main RTP routine 221 directs the processor circuit 110 to control the pre-heating device 150 while monitoring temperature measurement signals received from the fast radiometer 164, to pre-heat the workpiece 106 to the desired intermediate temperature $T_{INT}$ stored in the RTP parameters store 284. The processor circuit 110 also controls the power supply system 188 to charge the capacitor banks of the individual power supply systems 189, 191, 193 and 195 to the charging voltage V specified in the charging parameters store 278, in order to store the desired adjusted amount of electrical energy $E_{ADJ}$ specified in the charging parameters store 278. When the intermediate temperature has been reached, the main RTP routine 221 directs the processor circuit 110 to commence execution of the flash feedback control routine 224, which directs the processor circuit to signal the power supply system 188 to begin discharging the stored electrical energy to produce the irradiance flash. The execution of the flash feedback control routine 224 and the generation of the irradiance flash preferably commence immediately when or very quickly after the intermediate temperature has been reached, to minimize dwell time at the intermediate temperature.

Following completion of the thermal cycle, the main RTP routine 221 then directs the processor circuit 110 to execute the drift control routine 236, to effectively measure any changes in system efficiency, to allow the system to compensate for such changes when executing the next thermal cycle.

Stage 1: Predicting and Pre-Adjusting

Referring to FIGS. 1, 2 and 5, in this embodiment the processor circuit 110 is programmed or configured to predict a heating effect of an irradiance flash to be incident upon the surface 104 of the workpiece 106, in response to a measurement of a heating parameter of the surface 104. The processor circuit 110 is configured to pre-adjust the irradiance flash, in response to the predicted heating effect. In this embodiment, the heating effect is predicted in response to a measurement of an emissivity of the surface 104 and an amount of energy to be delivered to the surface 104 by the irradiance flash.

Figure 6:
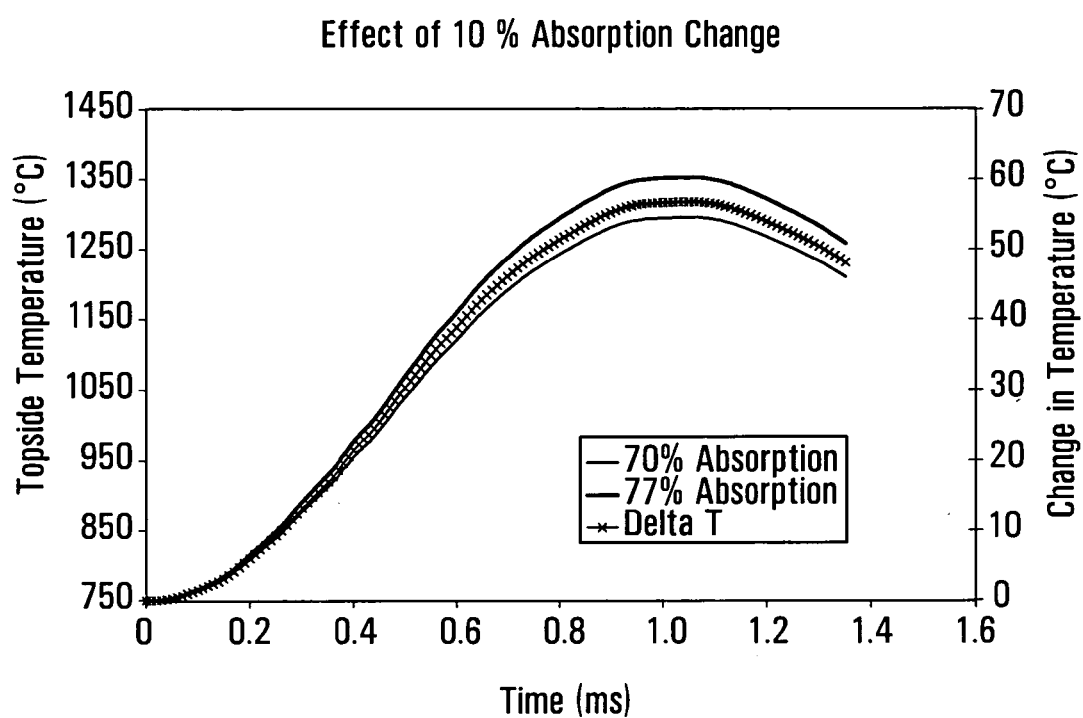
FIG. 6 is a graph illustrating the effect of a 10% variation in workpiece emissivity upon a surface temperature of the workpiece.

More particularly, in this embodiment the processor circuit 110 is configured to predict respective heating effects of similar irradiance flashes to be incident upon respective surfaces of a plurality of similar workpieces, in response to measurements of respective heating parameters of the surfaces, and is further configured to pre-adjust the flash for each one of the workpieces, in response to the predicted heating effects. More particularly still, in this embodiment the workpieces are ostensibly identical. In this regard, it has been found that even where a plurality of workpieces are ostensibly identical, their surfaces 104 may in fact have different emissivities, and may therefore absorb different percentages of the irradiance flash. Accordingly, even if the irradiance flash itself is virtually identical from workpiece to workpiece, such emissivity variations among ostensibly identical workpieces tend to produce different heating effects, such as different temperature trajectories and peak temperatures of the surface 104. For example, FIG. 6 illustrates that even a relatively small difference in emissivities of the surfaces of two workpieces may significantly affect the peak temperatures that their surfaces reach when subjected to an identical flash. Accordingly, in the present embodiment such different heating effects are predicted, and the irradiance flash is pre-adjusted prior to its commencement, to attempt to compensate for such variations. Alternatively, the methods of the present embodiment may be applied equally where the workpieces are not ostensibly identical or similar. For example, when a workpiece to be processed does not belong to one of the workpiece types whose thermal processing parameters have been pre-characterized and stored in the workpiece parameters store 240, the irradiance flash may be pre-adjusted for such a workpiece by measuring its emissivity, predicting the heating effect of the irradiance flash on the surface of the workpiece, and comparing it to the expected heating effect of such a flash upon a pre-characterized workpiece type.

To achieve such prediction and pre-adjustment, in the present embodiment the pre-adjustment routine 222 shown in FIG. 2 programs or configures the processor circuit 110 (or more particularly, the microprocessor 210) to co-operate with the second measurement system 500 shown in FIG. 5, to measure the heating parameter of the surface 104. More particularly, in this embodiment the heating parameter includes the emissivity of the surface 104, which in this embodiment is measured indirectly, by measuring the reflectivity of the surface (as discussed earlier herein, in the present embodiment, transmissivity of the workpiece may be ignored due to the short wavelengths of the irradiance flash, and hence, emissivity may be approximated as $\epsilon_W(\lambda)=1-R_W(\lambda)$). In this embodiment, the heating parameter is measured in a wavelength spectrum corresponding to the irradiance flash, which in this embodiment is a spectrum between 180 and 1400 nm. More particularly, in this embodiment a plurality of values of the heating parameter are measured at a plurality of respective wavelengths $\lambda=\{\lambda_1, \lambda_2, \ldots \lambda_N\}$ of the spectrum.

To achieve this, in the present embodiment, a set of values indicative of the intensity of an illumination spectrum produced by the illumination source 502 is first stored in the reference illumination intensity store 262 in the memory device 260. In the present embodiment, this is achieved by using a reference piece (not shown), although alternatively, other ways may be substituted (for example, by providing an additional spectrometer (not shown) for directly measuring the illumination intensity). In this embodiment, the reference piece has a known reflectivity $R_{REF}(\lambda)$ for the plurality of wavelengths $\lambda=\{\lambda_1, \lambda_2, \ldots \lambda_N\}$ of the spectrum corresponding to the irradiance flash. In the present embodiment, the reference piece includes a highly reflective polished aluminum wafer having external dimensions similar to those of the workpiece 106, although alternatively, any other suitable reference piece with a known reflectivity may be substituted. In embodiments where only a single reflectivity value such as a broadband reflectivity value is used instead of a plurality of reflectivity values, a reference piece having a known corresponding single reflectivity value will suffice. In this embodiment, the known reflectivity values $R_{REF}(\lambda)$ of the reference piece for the wavelengths $\lambda=\{\lambda_1, \lambda_2, \ldots \lambda_N\}$ are stored in the reference reflectivity store 261 of the memory device 260. The pre-adjustment routine 222 may direct the processor circuit 110 to load these values into the reference reflectivity store 261 from a non-volatile storage location such as the storage device 220, or alternatively, may direct the processor circuit 110 to obtain these known reflectivity values in another manner (such as by prompting a user of the RSC 112 to manually enter the values or a location at which they are stored, for example).

In this embodiment, the pre-adjustment routine 222 then directs the processor circuit 110 to control the illumination source 502, the detectors 504 and 516 and the probe 506, to illuminate an upper surface of the reference piece, and to measure the intensity of the illumination that is reflected by the reference piece. The processor circuit 110 receives from the detector 504 a plurality of measurement values $M_{REF}(\lambda)$ of the measured intensity of irradiance reflected by the reference piece at each of the wavelengths $\lambda=\{\lambda_1, \lambda_2, \ldots \lambda_N\}$, and calculates the illumination intensity $I_{REF}(\lambda)$ of the illumination from the illumination source 502 incident upon the reference piece, $I_{REF}(\lambda)=M_{REF}(\lambda)/R_{REF}(\lambda)$, for each of the wavelengths $\lambda=\{\lambda_1, \lambda_2, \ldots \lambda_N\}$. The illumination intensity values $I_{REF}(\lambda)$ are then stored in the reference illumination intensity store 262 in the memory device 260. In addition, in this embodiment the processor circuit 110 receives from the detector 516 a single value $I_{0REF}$, representing the broadband intensity of the illumination spectrum incident upon the reference piece, and stores this value in the reference broadband intensity register 263. As discussed in greater detail below, these stored values $I_{REF}(\lambda)$ and $I_{0REF}$ are used to determine the illumination spectrum $I_W(\lambda)$ incident on the surface 104 of the workpiece 106.

In this embodiment, it is assumed that the illumination spectrum produced by the illumination source 502 is spectrally stable, in the sense that the ratio of illumination intensity at any one wavelength in the spectrum to illumination intensity at any other wavelength in the spectrum remains constant, and does not change between the time at which the reference piece was illuminated and the subsequent time at which the workpiece is illuminated. However, the absolute magnitude of illumination intensity may vary (e.g., it is possible that the illumination intensity incident upon the workpiece may be slightly greater at all wavelengths, or alternatively, slightly lower at all wavelengths, than the illumination intensity incident upon the reference piece). To compensate for any "drift" that may affect the illumination source 502 over longer time-scales (i.e., any gradual changes that may affect the proportional intensity at one or more wavelengths relative to other wavelengths), the illumination intensity may be subsequently re-measured using the reference piece, and the contents of the reference illumination intensity store 262 and the reference broadband intensity register 263 may be refreshed accordingly. Such re-calibration may be performed periodically on a scheduled basis, or when observed temperature measurements during thermal processing indicate an inconsistency, for example. If desired, such re-calibration may be performed prior to each reflectivity measurement of each successive workpiece, although re-measuring the illumination intensity at such a frequency for calibration purposes may be disadvantageous for some embodiments unless it can be done sufficiently quickly to avoid slowing the throughput of the processing chamber 130.

Alternatively, as noted above, the illumination intensity incident upon the workpiece may be measured or predicted in any other suitable way.

In this embodiment, the pre-adjustment routine 222 then directs the processor circuit 110 to measure the heating parameter, which in this embodiment is the emissivity $\epsilon_W(\lambda)$ of the surface 104, at the plurality of wavelengths $\lambda=\{\lambda_1, \lambda_2, \ldots \lambda_N\}$ of the spectrum corresponding to the irradiance flash. In the present embodiment, the emissivity $\epsilon_W(\lambda)$ is measured indirectly, by measuring the reflectivity $R_W(\lambda)$ of the surface 104.

In this embodiment, measuring the heating parameter includes compensating for small-scale angular variations in the heating parameter. More particularly, in the present embodiment, compensating includes measuring the heating parameter over a sufficiently large area of the surface to effectively average out the small-scale angular variations. Thus, in the present embodiment, in which the surface 104 of the workpiece 106 includes a device side 122 of a semiconductor wafer 120, measuring the heating parameter over a sufficiently large area includes measuring the heating parameter over an area at least about 1 cm wide. More particularly, in this embodiment the heating parameter is measured over an area at least about 2 cm wide on the surface 104 of the workpiece 106, using the optical fiber probe 506.

In this regard, it has been found that measuring reflectivity over such an area, which is large compared to the structural sizes of devices formed on the surface 104, tends to average out or compensate for the angular dependence of reflections caused by such devices, thereby reducing measurement error as compared to measurement over a smaller portion of the surface 104. Alternatively, the measurement area may be smaller than 1 cm while still large compared to the sizes of devices on the surface 104, and hence sufficiently large to average out small-scale angular variations in reflection. Or, as a further alternative, the measurement area may be larger than 2 cm, and may include the entire surface 104, for example. Alternatively, other ways of reducing such errors may be substituted. For example, an integrating sphere may be employed to measure hemispherical reflectivity, although integrating spheres may be undesirable for certain specific embodiments due to the possibility of contamination resulting from the close proximity of such spheres to the object being measured.

Thus, in this embodiment the processor circuit 110 is directed to control the illumination source 502 to illuminate the 2 cm-wide area on the surface 104 of the workpiece 106, with an irradiance spectrum including wavelengths $\lambda = \{\lambda_1, \lambda_2, \ldots \lambda_N\}$ of the irradiance flash. It will be recalled that in the present embodiment, the illumination source 502 includes a deuterium-halogen source. Thus, in the present embodiment the surface 104 is illuminated with an irradiance spectrum produced by an illumination source other than the irradiance system 180 that produces the irradiance flash.

In the present embodiment, as the surface 104 of the workpiece 106 is being illuminated by the illumination source 502, the pre-adjustment routine 222 directs the processor circuit 110 to receive signals from the detector 516, representing the broadband illumination intensity $I_{0W}$ being produced by the illumination source 502. The processor circuit is directed to store the illumination intensity value in the workpiece broadband intensity register 264. Concurrently, in this embodiment the pre-adjustment routine 222 directs the processor circuit 110 to receive signals from the detector 504, representing the measured reflected intensity $M_W(\lambda)$ of the illumination spectrum reflected by the surface 104 of the workpiece 106 at each of the wavelengths $\lambda = \{\lambda_1, \lambda_2, \ldots \lambda_N\}$. The processor circuit is directed to store the measured reflected intensity values $M_W(\lambda)$ in the reflection intensity store 266.

In the present embodiment, for each wavelength $\lambda$, the pre-adjustment routine 222 directs the processor circuit 110 to calculate the illumination intensity value $I_W(\lambda)$ and the reflectivity $R_W(\lambda)$ of the surface 104 at that wavelength. To calculate the illumination intensity values $I_W(\lambda)$ representing the intensity of illumination incident on the surface 104, the processor circuit is directed to multiply the values $I_{REF}(\lambda)$ stored in the reference illumination intensity store 262, by the ratio of the illumination intensity value $I_{0W}$ stored in the workpiece broadband intensity register 264 to the illumination intensity value $I_{0REF}$ stored in the reference broadband intensity register 263, i.e., $I_W(\lambda) = I_{REF}(\lambda) * I_{0W}/I_{0REF}$. The processor circuit is directed to store the resulting workpiece illumination intensity values $I_W(\lambda)$ in the illumination intensity store 265.

To calculate the reflectivity $R_W(\lambda)$ of the surface 104 at a particular wavelength, the pre-adjustment routine 222 directs the processor circuit 110 to divide the measured reflected intensity value $M_W(\lambda)$ for that wavelength stored in the reflection intensity store 266 by the corresponding illumination intensity value $I_W(\lambda)$ for that wavelength stored in the workpiece illumination intensity store 265, i.e., $R_W(\lambda) = M_W(\lambda)/I_W(\lambda)$. The processor circuit 110 is directed to store the corresponding reflectivity values $R_W(\lambda)$ for each of the wavelengths $\lambda = \{\lambda_1, \lambda_2, \ldots \lambda_N\}$ in the workpiece reflectivity store 267 in the memory device 260.

In this embodiment, the processor circuit 110 is then directed to calculate and store corresponding workpiece emissivity values in the workpiece emissivity store 268. In this embodiment, it is assumed that the workpiece is opaque, so that its transmissivity is zero. Thus, for each reflectivity value $R_W(\lambda)$, the corresponding stored emissivity value is $\epsilon_W(\lambda) = 1 - R_W(\lambda)$.

If desired, the emissivity and/or reflectivity values may be corrected to compensate for temperature differences. In this regard, the foregoing measurement of reflectivity may be conducted outside the processing chamber 130 at room temperature, whereas the temperature of the workpiece 106 may be considerably hotter (e.g., hundreds of degrees Celsius) when the surface 104 is initially subjected to the irradiance flash, and the temperature of the surface 104 will be hotter still (e.g., in the vicinity of the melting point of silicon) when it is actually heated by the flash. As reflectivity and emissivity tend to vary weakly with temperature, if desired, a correction may be applied to the stored reflectivity and/or emissivity values, to compensate for the fact that the reflectivity and emissivity of the surface 104 will be slightly different at the time that the surface 104 is subjected to the irradiance flash than they were at the time they were measured, due to the aforementioned temperature difference. Such corrections to the stored reflectivity and/or emissivity values due to differences in the temperature of surface 104 may be empirically determined for a variety of workpieces. Alternatively, as such corrections are typically small and within the capabilities of the Stage 2 real-time feedback control of flash as described below, such corrections may be omitted, if desired.

In this embodiment, the pre-adjustment routine 222 then directs the processor circuit 110 to predict the heating effect of the irradiance flash, which may effectively include predicting a peak temperature of the surface 104.

In the present embodiment, predicting the heating effect of the irradiance flash includes predicting an amount of energy of the irradiance flash to be absorbed by the surface 104. More particularly, in this embodiment the pre-adjustment routine 222 configures the processor circuit 110 to predict the heating effect in response to a measurement of an emissivity of the surface 104 and an amount of energy to be delivered to the surface 104 by the irradiance flash.

To achieve this, in the present embodiment, the pre-adjustment routine 222 configures the processor circuit 110 to convolve the plurality of values of the heating parameter at the plurality of respective wavelengths of the spectrum with a plurality of irradiance values indicative of respective amounts of irradiance at the respective wavelengths to be delivered to the surface by the flash. More particularly, in this embodiment the plurality of values of the heating parameter include the plurality of emissivity values stored in the workpiece emissivity store 268, which in this embodiment were measured by measuring the corresponding reflectivity values of the workpiece. Thus, in this embodiment the processor circuit 110 is directed to convolve a plurality of absorptivity values of the surface 104 at the plurality of respective wavelengths $\lambda=\{\lambda_1, \lambda_2, \ldots \lambda_N\}$ with a plurality of irradiance energy values $I_{FLASH}(\lambda)$ indicative of respective amounts of radiant energy at the respective wavelengths to be delivered to the surface 104 by the flash.

In this embodiment, the absorptivity values for the convolution are the emissivity values $\epsilon(\lambda)$ stored in the workpiece emissivity store 268. With respect to the irradiance energy values for the convolution, in this embodiment, initial values for the plurality of irradiance energy values $I_{FLASH}(\lambda)$ are simulated based upon optical and geometrical properties of the system 100. Alternatively, the initial values for the plurality of irradiance energy values $I_{FLASH}(\lambda)$ may be set equal to a set of measured irradiance energy values $I_{FLASH}(\lambda)$ for a previous flash (such as the most recent flash), or an average of irradiance energy values for a set of previous flashes (such as a running average over the most recent N flashes, for example). In such embodiments, the irradiance energy values may be obtained by directly measuring the irradiance flash; if desired, separate equipment, such as an additional measurement system similar to the measurement system 102, may be provided to directly measure the irradiance of the flash, and to compensate for the effects of the system 100 to determine the values $I_{FLASH}(\lambda)$ indicative of flash energy actually arriving at the surface 104. Alternatively, the initial values for the plurality of irradiance energy values $I_{FLASH}(\lambda)$ may be stored, in the storage device 220, for example, or elsewhere.

In this embodiment, the simulation of the plurality of irradiance energy values indicative of radiant energy delivered to the surface 104 by the irradiance flash is achieved by the processor circuit 110 under the direction of the simulation routine 226. In this embodiment, the simulation routine 226 includes LIGHTTOOLS™ 3D solid modelling and illumination analysis software, available from Optical Research Associates of Pasadena, Calif., USA. The latter software analyzes the optical and geometric properties of the system 100, and calculates the amounts of energy $I_{FLASH}(\lambda)$ of the irradiance flash that will actually arrive at the surface 104. For example, in this embodiment the electro-optical conversion efficiency (i.e., the efficiency of the conversion of stored electrical energy in the capacitor banks into electromagnetic energy of the irradiance flash) is approximately 44%. Likewise, of the total irradiance flash that is produced, some is absorbed by chamber walls, water-windows or other system components, and only a portion (in this embodiment approximately 36%) of the total energy of the irradiance flash actually arrives at the surface 104. Thus, in this embodiment the overall efficiency of converting stored electrical energy into electromagnetic energy incident on the surface 104 is 0.44*0.36=0.16. Therefore, in this embodiment, the irradiance system 180 can deliver up to 387.1 kJ*0.16=approximately $6 \times 10^4$ J of electromagnetic energy to the surface 104 of the workpiece. In this embodiment, the simulation routine 226 directs the processor circuit 110 to analyze the system 100 on a wavelength-by-wavelength basis, taking into account the foregoing electrical and optical energy losses, to calculate the respective amounts $I_{FLASH}(\lambda)$ of irradiance flash energy that will arrive at the surface 104 of the workpiece 106, at each of the wavelengths $\lambda=\{\lambda_1, \lambda_2, \ldots \lambda_N\}$. The simulation routine 226 directs the processor circuit 110 to store the resulting irradiance energy values $I_{FLASH}(\lambda)$ in the irradiance energy store 270; if desired, the irradiance energy values $I_{FLASH}(\lambda)$ may also be stored in the storage device 220 for future use.

In this embodiment, the pre-adjustment routine 222 directs the processor circuit to predict the heating effect of the irradiance flash by convolving the emissivity values $\epsilon(\lambda)$ stored in the workpiece emissivity store 268, with the irradiance energy values $I_{FLASH}(\lambda)$ stored in the irradiance energy store 270. More particularly, in this embodiment the convolution is $E_i = \Sigma_j (\epsilon)_j * (I_{FLASH})_{i-j}$.

The processor circuit 110 is directed to store these values $E_i$ in the absorbed energy store 272 in the memory device 260.

In the present embodiment, predicting the heating effect further includes summing a plurality of absorbed energy values resulting from the convolving. More particularly, in this embodiment the pre-adjustment routine 222 directs the processor circuit 110 to sum all of the energy values $E_i$ stored in the absorbed energy store 272, to produce an energy indicator value $E_{TOT}$, and to store this energy indicator value in the energy indicator register 274 in the memory device 260.

The processor circuit 110 is then directed to effectively compare this energy indicator value with a previously stored reference energy indicator value $E_{REF}$. In this embodiment, the previously stored reference energy indicator value $E_{REF}$ is calculated in the same manner as the energy indicator $E_{TOT}$, for a reference piece (not shown) rather than for the workpiece 106. More particularly, in this embodiment the reference piece is the workpiece that was used to create the record in the workpiece parameters store 240 for the present workpiece type ($W_{ID}$), from which the processor circuit obtained the characterizing values $O_{TE}$ and $S_{TE}$ that were used by the processor circuit to calculate the electrical charge energy and voltage values $E_{CHN}$, $E_{ADJ}$ and V, as discussed above in connection with the main RTP routine 221. Thus, in this embodiment the reference energy indicator value $E_{REF}$ is stored in the record in the workpiece parameters store corresponding to the workpiece type identifier ($W_{ID}$) for the workpiece 106.

Alternatively, if the workpiece 106 has not been previously characterized and does not have a workpiece type identifier $W_{ID}$, then a record in the workpiece parameters store 240 for a default or generic workpiece type is used to extract the characterizing values $O_{TE}$ and $S_{TE}$ under the direction of the main RTP routine 221 as discussed above, and that same record is used to extract the reference energy indicator value $E_{REF}$ under the direction of the pre-adjustment routine.

In this embodiment, the pre-adjustment routine 222 then directs the processor circuit 110 to pre-adjust the irradiance flash. More particularly, in this embodiment the processor circuit is directed to pre-adjust an amount of stored electrical energy to be used to generate the irradiance flash. In this embodiment, the stored electrical energy includes electrical charge stored in a capacitor bank. More particularly, in this embodiment the stored electrical energy to be pre-adjusted is the electrical charge stored in the power supply system 188, or more particularly still, in the capacitor banks of the four respective individual electrical power supply systems 189, 191, 193 and 195.

In this embodiment, the electrical energy stored in the power supply system 188 is pre-adjusted in response to a comparison of the energy indicator $E_{TOT}$ for the workpiece 106 to the previously stored energy indicator $E_{REF}$ for the reference piece, as discussed in greater detail below.

In this embodiment, it will be recalled that the amount of electrical energy $E_{ADJ}$ to be stored in the power supply system 188 (or more particularly, in the capacitor banks thereof) and the corresponding capacitor charging voltage V to generate the irradiance flash are determined by the processor circuit 110 under the direction of the main RTP routine 221, which stores the charging voltage V and the corresponding charge energy $E_{ADJ}$ in the charging parameters store 278, in response to user-specified parameters defining the desired thermal cycle and identifying the type of workpiece to be processed.

In this embodiment, the pre-adjustment routine 222 directs the processor circuit to pre-adjust the irradiance flash. To achieve this, in this embodiment the processor circuit reads the user-specified or predefined parameter ΔT stored in the RTP parameters store 284, which defines the magnitude of the desired temperature jump, and multiplies ΔT by $E_{REF}/E_{TOT}$, to obtain an emissivity-corrected temperature jump parameter $\Delta T_{EC}$. The emissivity-corrected temperature jump parameter $\Delta T_{EC}$ and the workpiece characterizing values $O_{TE}$ and $O_{TE}$ are then used to obtain an emissivity-corrected electrical energy value $E_{CHN\_EC}$, in the same manner as discussed above in connection with the main RTP routine 221:

$$E_{\text{CHN\_EC}} = e^{\left(\frac{\Delta T_{EC} - O_{TE}}{S_{TE}}\right)}$$

Similarly, as discussed above in connection with the main RTP routine 221, to correct for any deterioration or changes to the efficiency of the system 100 since the workpiece characterizing values $O_{TE}$ and $O_{TE}$ were generated and stored, the pre-adjustment routine 222 further directs the processor circuit to use the new emissivity-corrected charge value to calculate an emissivity-corrected and efficiency-adjusted electrical energy value, $$E_{\text{ADJ\_EC}} = E_{\text{CHN\_EC}}\left(\frac{C_{TE}}{C_{\textit{eff}(N)}}\right)$$

In this embodiment, the pre-adjustment routine 222 further directs the processor circuit to use the emissivity-corrected and efficiency-adjusted electrical energy value $E_{ADJ\_EC}$ to determine a corresponding emissivity-corrected, efficiency-adjusted charge voltage $V_{EC}$, either by calculation or by reference to the charge look-up table 228, in a manner similar to that discussed above in connection with the main RTP routine 221. (Alternatively, in embodiments where efficiency drift correction is omitted, the emissivity-corrected charging voltage may be determined from $E_{CHN\_EC}$ rather than $E_{ADJ\_EC}$.) The emissivity-corrected and efficiency-adjusted charge voltage $V_{EC}$ and charging energy $E_{ADJ\_EC}$ are then written to the charging parameters store 278, over-writing the values of $E_{ADJ}$ and V that were previously stored by the processor circuit under the direction of the main RTP routine 221. Thus, the new adjusted charge voltage value $V_{EC}$ specifies the emissivity-corrected voltage that will be used to charge the capacitor banks of the power supply system 188 when the workpiece 106 has been loaded into the chamber 130 for processing, while the new value of $E_{ADJ\_EC}$ specifies the corresponding emissivity-corrected electrical charge energy, which may be used for monitoring the efficiency of the system (in Stage 3, as discussed below). If the energy indicator $E_{TOT}$ for the workpiece 106 is greater than the energy indicator $E_{REF}$ for the reference piece that was used to create the corresponding record in the workpiece parameters store 240, then the workpiece 106 will tend to absorb a greater percentage of the energy of the irradiance flash than the reference workpiece, with the result that less irradiant energy is required to heat the surface 104 of the workpiece 106 to a given temperature than would be required to heat a similar surface of the reference piece to the same temperature. In such a case, $\Delta T_{EC}$ is less than ΔT. In other words, the emissivity-corrected charging voltage $V_{EC}$ corresponds to a voltage that would have been required to cause the reference piece to experience a temperature jump of only $\Delta T_{EC}$ rather than ΔT; as a first-order correction, this same charging voltage $V_{EC}$ that would have heated the reference piece surface by only $\Delta T_{EC}$ is expected to heat the surface 104 by a temperature jump of ΔT, in view of the greater emissivity of the surface 104 of the workpiece as compared to the surface of the reference piece to which the presently used record in the workpiece parameters store 240 corresponds. Thus, in such a case, the charging voltage required to cause the surface 104 to experience a temperature jump of ΔT is less than that required to induce an identical temperature jump in a surface of the reference piece. Conversely, if the energy indicator $E_{TOT}$ for the workpiece 106 is lower than the energy indicator $E_{REF}$ for the reference piece to which the presently used record in the workpiece parameters store 240 corresponds, then the adjusted index $\Delta T_{EC}$ will be greater than the user-specified or predefined value ΔT, and the corresponding voltage $V_{EC}$ will be higher than a voltage V that would have been required to induce a temperature jump of ΔT in a surface of the reference piece; as a first-order correction, this charging voltage $V_{EC}$ is expected to induce the desired temperature jump of ΔT in the surface 104.

Stage 2: Real-Time Feedback Control of Flash

Referring to FIGS. 1 and 2, in this embodiment, the flash feedback control routine 224 configures the processor circuit 110 to cooperate with the measurement system 102 to measure the temperature of the surface 104 of the workpiece 106 during an initial portion of an irradiance flash incident on the surface 104. The flash feedback control routine 224 further configures the processor circuit to cooperate with the irradiance system 180 to control a power of a remaining portion of the irradiance flash, in response to the temperature during the initial portion.

In this embodiment, the irradiance flash has a duration of less than a thermal conduction time of the workpiece, which in this embodiment is on the order of about $1 \times 10^1$ ms. More particularly, in this embodiment the irradiance flash has a duration of less than about 2 ms. More particularly still, in this embodiment the irradiance flash has a duration on the order of about 1 ms.

In this embodiment, the irradiance flash tends to be significantly more powerful than typical irradiance flashes that may have been previously subjected to real-time feedback control. In this regard, in this embodiment the irradiance flash delivers energy to the surface at a rate of at least about 1 MW. More particularly, in this embodiment the irradiance flash delivers energy to the surface at a rate of at least about 10 MW; more particularly still, at a rate of at least about 30 MW; and more particularly still, at a rate of at least about 60 MW. For example, if the four capacitor banks of the power supply system 188 are all charged at 3500 V to store a total of 387.1 kJ of electrical energy, and if this electrical energy is discharged in a flash having a duration between one and two milliseconds, then the rate at which electrical energy is discharged from the power supply system 188 is between 193.5 and 387 MW. If this electrical energy is converted at an illustrative efficiency of 44% to 170.324 kJ of electromagnetic radiation energy, then the power of the irradiance flash over its 1-2 ms duration is between 85.1 and 170.3 MW. If the system 100 delivers this electromagnetic energy to the surface 104 at an illustrative efficiency of 36%, then approximately 61.3 kJ of energy would be delivered to the surface 104, at an average rate of 30.7 MW (for a 2 ms flash) to approximately 61.3 MW (for a 1 ms flash). Alternatively, the capacitor banks may be charged to less than their maximum charges, for lower energy delivery rates, if desired. Conversely, capacitance banks with larger capacitances and/or charging voltages may be substituted, to provide even greater energy delivery rates, if desired.

In this embodiment, the initial portion of the flash (during which the temperature of the surface 104 is measured) has a duration of less than about one millisecond. More particularly, in this embodiment the initial portion has a duration of less than about one-half millisecond, or more particularly still, less than about $6 \times 10^2$ microseconds. More particularly still, in this embodiment the irradiance flash has a duration on the order of about one and a half milliseconds, and the initial portion of the flash has a duration of about $4 \times 10^2$ microseconds. In this regard, in this embodiment, the duration of the initial portion of the flash is selected by balancing two competing factors: the desire for more accurate temperature measurement data, which favors a longer initial portion in order to acquire more temperature measurement data; and the competing desire to be able to act quickly enough to control the remaining portion of the flash in order to achieve a desired peak temperature, which favors a shorter initial portion. With respect to the latter concern, in an illustrative embodiment, it has been found that adjustments that increase or decrease the peak arc current supplied to the flash lamp tend to increase or decrease the peak temperature of the surface 104, whereas adjustments that are made after the peak arc current has already occurred (and which therefore do not increase or decrease the peak arc current) tend to alter the temporal temperature profile of the surface 104, but may not appreciably alter the peak temperature of the surface 104, depending upon the shape of the current pulse (for example, alteration of a bell-shaped current pulse similar to those shown in FIG. 7 subsequent to the current peak may not appreciably alter the peak surface temperature, whereas alteration of an alternative flat-topped current pulse (not shown) subsequent to arrival at the flat-topped current peak may indeed affect the peak workpiece surface temperature). In this embodiment, to allow sufficient time to adjust the peak temperature of the surface 104, it is desirable to define the initial portion to be sufficiently short that the remaining portion of the flash, which is to be controlled, commences prior to the peak of the arc current. Thus, for example, in an alternative embodiment, the initial portion may have a duration of less than about one-half, or even less than about one-quarter, of a duration that the irradiance flash would have had if it had not been controlled by the intervention of the processor circuit 110 under the direction of the flash feedback control routine 224.

In this embodiment, measuring the temperature of the surface 104 during the initial portion of the irradiance flash includes obtaining a plurality of measurements of the temperature of the surface at a plurality of respective times during the initial portion of the irradiance flash. For example, this may include sampling the temperature at a rate of at least $1 \times 10^4$ Hz, or alternatively, at a rate of at least $1 \times 10^5$ Hz, for example. Thus, in this embodiment, if the initial portion of the flash has a duration of 0.4 ms, for example, sampling the temperature of the surface 104 at the latter rate of $10^5$ Hz yields 40 temperature measurements of the surface 104 during the initial portion of the irradiance flash.

In this embodiment, to produce the irradiance flash, the main RTP routine 221 directs the processor circuit 110 to commence execution of the flash feedback control routine 224, which directs the processor circuit to signal the power supply system 188 to begin discharging the stored electrical energy, to produce the irradiance flash. At the same time, the processor circuit is directed to cooperate with the measurement system 102, to measure the device side temperature during the initial portion of the flash, and to control the remaining portion of the flash accordingly.

In this embodiment, the temperature measurements of the surface 104 are obtained with a radiometer, which in this embodiment includes a high-speed radiometer. More particularly, in this embodiment the radiometer includes the ultra-fast radiometer 400, which in turn includes the InGaAs photodiode 406. It will be recalled that in the present embodiment, the ultra-fast radiometer 400 samples the temperature of the surface 104 at a rate of 1 MHz. Thus, in this embodiment, to effectively sample the device side surface temperature at a slower rate of $10^5$ Hz, the flash feedback control routine 224 directs the processor circuit 110 to store every $10^{th}$ sample received from the ultra-fast radiometer 400 via the I/O 460, in the device side temperature store 280 in the memory device 260. Thus, in the present embodiment, the processor circuit 110 receives and stores a new temperature measurement of the surface 104 every 10 μs. In this embodiment, the processor circuit 110 stores each such temperature measurement in association with a time index value, representing the amount of time that has elapsed since commencement of the irradiance flash (e.g., t=0, t=10 μs, t=20 μs, t=30 μs, etc.). In the present embodiment, the first such surface temperature measurement (t=0) occurs simultaneously with the commencement of the electrical discharge.

The flash feedback control routine 224 continues to direct the processor circuit 110 to obtain and store a new temperature measurement of the surface 104 every 10 μs. In this embodiment, by way of example, it is assumed that the initial portion of the flash has a duration of 0.4 ms, so that 40 such measurements of the temperature of the surface 104 are stored in the device side temperature store 280 by the time the initial portion of the flash has ended.

In this embodiment, the flash feedback control routine 224 then directs the processor circuit 110 to effectively compare the measured temperature to an expected temperature. More particularly, in this embodiment the processor circuit is directed to compare at least one of the plurality of stored temperature measurements to an expected temperature trajectory.

In this embodiment, the expected temperature trajectory is pre-calculated and stored, prior to commencement of the thermal cycle to which the workpiece 106 is subjected. To achieve this, in the present embodiment the processor circuit 110 executes the thermal analysis routine 230, to calculate the expected temperature trajectory on the basis of the user-specified or predefined parameters defining the desired thermal cycle. In this embodiment, the thermal analysis routine 230 includes TAS Thermal Analysis Software, manufactured by Harvard Thermal Inc. of Harvard, Mass., USA. Alternatively, other thermal analysis routines may be substituted. More generally, other ways of determining an expected temperature or temperature trajectory for the surface 104 of the workpiece 106 may be substituted. The resulting expected temperature data is stored in the expected temperature store 282 in the memory device 260.

In this embodiment, at the end of the initial portion of the flash (in this embodiment, approximately 0.4 ms after the commencement of the flash), the flash feedback control routine 224 directs the processor circuit 110 to compare at least one of the plurality of temperature measurements stored in the device side temperature store 280 to the expected temperature trajectory data stored in the expected temperature store 282. More particularly, in this embodiment the processor circuit 110 compares the most recent temperature measurement value (in this example, the temperature measurement at time t=400 μs) to the corresponding expected temperature value stored in the expected temperature store 282 for the time at which this most recent temperature measurement was obtained. More particularly still, in this embodiment the processor circuit calculates a difference value equal to the measured temperature minus the expected temperature, and stores the resulting difference value in the temperature error register 288.

Alternatively, however, other ways of comparing the actual measured temperature to the expected temperature may be substituted. For example, if desired, a projected peak temperature may be extrapolated from the measured temperature data, and may be compared to the expected peak temperature, i.e. the highest temperature value stored in the expected temperature store 282. To minimize processing time required to extrapolate such a projected peak temperature, a large number of possible temperature trajectories may be pre-calculated and pre-stored by the processor circuit 110 under the direction of the thermal analysis routine 230, prior to commencement of the thermal cycle. During the subsequent irradiance flash, the flash feedback control routine 224 may direct the processor circuit to locate a particular pre-stored temperature trajectory that most closely corresponds to the actual measured temperature data, to extract the peak temperature value in the identified temperature trajectory, and to compare the extracted peak temperature value to the peak temperature value stored in the expected temperature store 282.

In addition, comparisons of actual measured temperature to expected temperature need not be made on the basis of a single data point. For example, if desired, quantities such as the first derivative (rate of change) and the second derivative (rate of acceleration/deceleration) for the complete set of measured temperature values may be calculated and employed in the comparison. If desired, curve-fitting techniques may be employed, although the complexity of such curve-fitting techniques may be limited by available processing speed in a particular embodiment, depending upon available equipment, in view of the need to conduct the comparison sufficiently quickly to be able to alter the remaining portion of the irradiance flash.

In the present embodiment, if the comparison of actual measured temperature to expected temperature indicates that the surface 104 is being heated too quickly and will likely exceed the desired peak temperature (in this example, if the temperature difference value stored in the temperature error register 288 is positive), the flash feedback control routine 224 directs the processor circuit 110 to modify the remaining portion of the irradiance flash to reduce the peak temperature of the surface 104. More particularly, in this embodiment modifying includes reducing an energy output of the remaining portion of the irradiance flash. More particularly still, in this embodiment the processor circuit 110 uses the results of the comparison (in this embodiment, the contents of the temperature error register 288) to address the current reduction look-up table 232, to determine a time at which a power reduction circuit of each of the individual electrical power supply systems 189, 191, 193 and 195 is to be activated. In the present embodiment, in which two separate power reduction circuits 320 and 350 are provided, the current reduction look-up table 232 may include a binary flag to indicate which one of the power reduction circuits 320 and 350 is to be activated, with the latter being capable of greater power reduction in a shorter period of time. Alternatively, in embodiments where only a single power reduction circuit is provided, such a flag may be omitted. In this embodiment, in addition to specifying a time at which the relevant power reduction circuit is to be activated, the addressed record in the current reduction look-up table 232 also specifies a flash intervention effect indicator F, which the processor circuit 110 is directed to temporarily store in the flash intervention effect register 290, for later use by the processor circuit under the direction of the drift control routine 236, as discussed in greater detail below.

Figure 7:
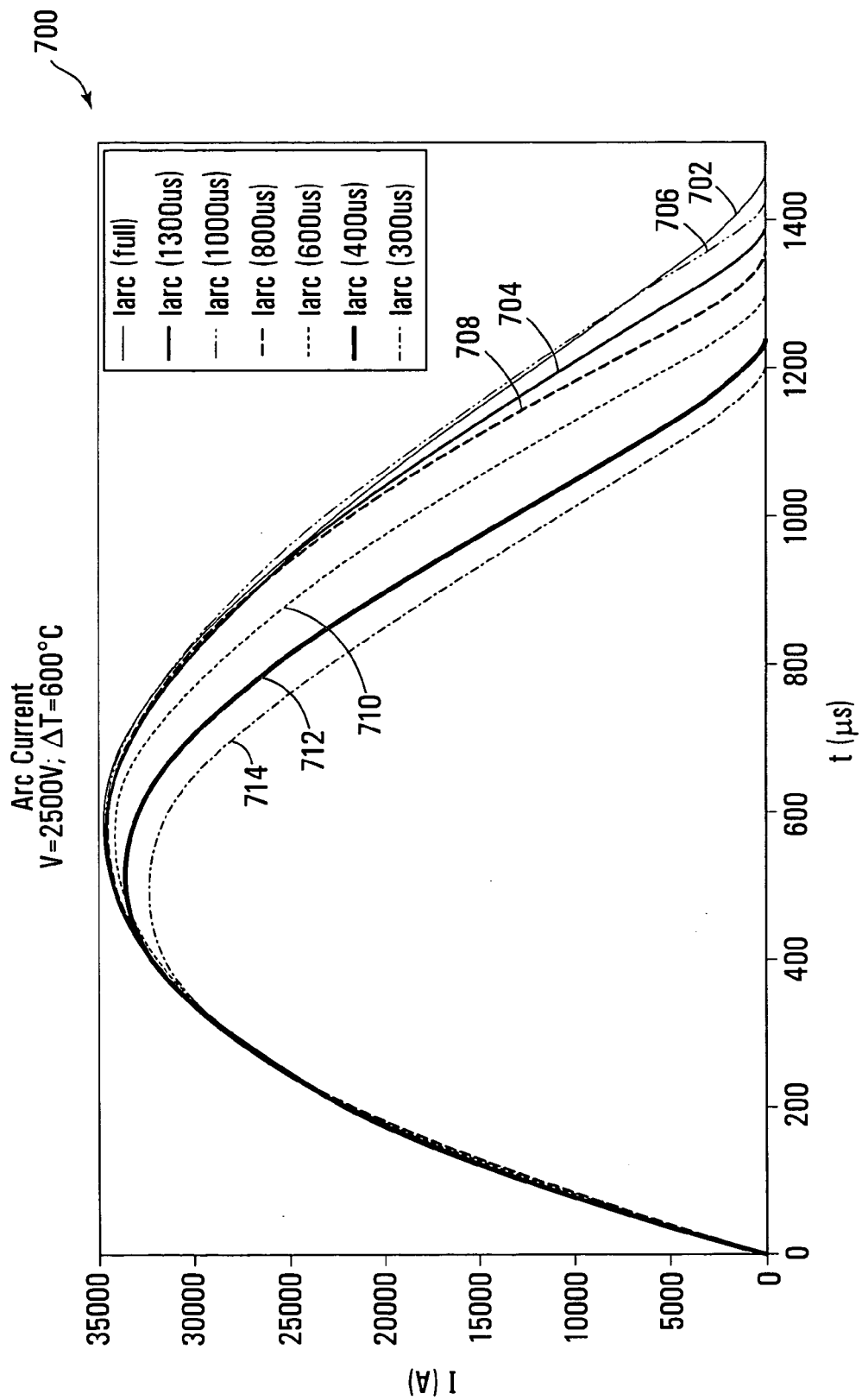
FIG. 7 is a graph illustrating electrical arc currents of an irradiance system shown in FIG. 1 used to produce an irradiance flash, when a power reduction circuit is activated at different times during the flash.

Referring to FIGS. 2, 3 and 7, it will be recalled that in the present embodiment, each power reduction circuit 320 includes a crowbar circuit connected in parallel with the capacitor bank 328. In this embodiment, the capacitor bank 328 stores the electrical energy that will be used to produce the irradiance flash. Prior to commencement of the flash, the thyristors 322, 332 and 336 shown in FIG. 3 are all in non-conducting states, which, coupled with the presence of the diode 342, prevents the capacitor bank 328 from discharging. To commence the irradiance flash, the processor circuit 110 applies a gate voltage to the thyristor 336 to place it in a conducting state, thus allowing the capacitor bank 328 to begin discharging its stored electrical energy through the flash lamp 182, the resistor 340, the inductor 338 and the thyristor 336. If, as a result of the measurements from the initial portion of the flash and the comparison described above, the processor circuit 110 determines that the power output of the remaining portion of the flash should be reduced using the power reduction circuit 320, the processor circuit 110 modifies the remaining portion of the irradiance flash by applying a gate voltage to the thyristor 322 at the time specified by the addressed record in the current reduction look-up table 232 as discussed above, to cause the thyristor to transition from a non-conducting state to a conducting state. Effectively, therefore, a short is placed across the capacitor bank 328, allowing the capacitor bank to partly discharge through the thyristor 322, the inductor 324 and the resistor 326, as well as continuing to partly discharge through the flash lamp 182, the resistor 340, the inductor 338 and the thyristor 336. Thus, when the crowbar circuit is fired, an electric current begins to travel through the thyristor 322, the inductor 324 and the resistor 326, and the arc current (i.e. the electric current travelling through the flash lamp) is correspondingly reduced.

Referring to FIG. 7, various curves representing the arc current over time are shown generally at 700, for an illustrative situation in which the capacitor bank 328 is charged at 2500 V and is then abruptly discharged by firing the thyristor 336 to produce the irradiance flash. A first curve 702 represents the arc current over the duration of the irradiance flash with no current reduction, i.e., without any activation of the power reduction circuit 320. A second curve 704 represents the arc current if the power reduction circuit is activated 1.3 ms after the commencement of the irradiance flash; a third curve 706 represents the arc current if the power reduction circuit is activated 1 ms after the commencement of the irradiance flash; a fourth curve 708 represents the arc current if the power reduction circuit is activated 0.8 ms after the commencement of the irradiance flash; a fifth curve 710 represents the arc current if the power reduction circuit is activated 0.6 ms after the commencement of the irradiance flash; a sixth curve 712 represents the arc current if the power reduction circuit is activated 0.4 ms after the commencement of the irradiance flash; and a seventh curve 714 represents the arc current if the power reduction circuit is activated 0.3 ms after the commencement of the irradiance flash. In the examples shown in FIG. 7, activation of the power reduction circuit 320 earlier than about 0.6 ms after the commencement of the flash has the effect of reducing the peak arc current, as well as reducing the overall energy output, and these effects tend to cause the surface 104 to reach a lower peak temperature than it otherwise would have reached. In contrast, activation of the power reduction circuit 320 after the maximum temperature is reached at about 0.7 ms after the commencement of the flash tends to reduce the subsequent power of the flash but does not appreciably affect the peak arc current, with the result that the peak temperature of the surface 104 is unlikely to be appreciably diminished, although its subsequent cooling rate may be slightly faster.

Alternatively, if the contents of the current reduction look-up table 232 corresponding to the temperature difference value stored in the temperature error register 288 indicate that the second power reduction circuit 350 is to be activated, the flash feedback control routine 224 directs the processor circuit 110 to reduce the energy output of the remaining portion of the irradiance flash by activating the second power reduction circuit 350. To achieve this, in this embodiment the processor circuit 110 applies a gate voltage to the thyristor 352 at the time specified by the addressed record in the current reduction look-up table 232 as discussed above, to cause the thyristor to transition from its initial non-conducting state to a conducting state. As the second power reduction circuit 350 has a lower impedance than the flash lamp 182, this allows the electric current supplied by the capacitor bank 328 to discharge through the inductor 354 and the resistor 356 rather than through the flash lamp 182.

It will be recalled that in the present embodiment, the second power reduction circuit 350 is connected in parallel with the flash lamp 182, in contrast with the first power reduction circuit 320, which is connected in parallel with the capacitor bank 328. Activation of the first power reduction circuit 320 effectively shorts across the capacitor bank 328, but does not prevent electric current from travelling through the flash lamp 182, through the inductor 338, and back through the free wheeling diode 342. In contrast, activation of the second power reduction circuit 350 effectively shorts across the flash lamp 182 itself. In comparison with the first power reduction circuit 320, activation of the second power reduction circuit 350 causes a more rapid fall time, i.e., a more rapid reduction in the electric current flowing through the flash lamp 182, and a correspondingly more rapid reduction in the power of the irradiance flash. At the same time, however, activation of the second power reduction circuit 350 may cause greater stress on system components, and may tend to waste more electrical energy than the first power reduction circuit 320. Thus, the second power reduction circuit 350 may be provided as either a supplement to, or a replacement for, the first power reduction circuit 320. Alternatively, the second power reduction circuit 350 may be omitted if desired.

Conversely, if the comparison of the measured temperature values in the device side temperature store 280 to the expected temperature trajectory stored in the expected temperature store 282 indicates that the surface 104 is being heated too slowly and will likely not reach the desired peak temperature (in this example, if the temperature difference value stored in the temperature error register 288 is negative), the flash feedback control routine 224 directs the processor circuit 110 modify the remaining portion of the irradiance flash to increase the peak temperature of the surface 104. More particularly, in this embodiment, controlling the remaining portion of the flash includes increasing a peak power output of the remaining portion of the irradiance flash. In this embodiment, increasing the peak power output includes activating a power boost circuit, which in this embodiment includes firing an inductive crowbar circuit. More particularly, in this embodiment the processor circuit 110 uses the results of the comparison (in this embodiment, the contents of the temperature error register 288) to address the current boost look-up table 234, to determine a time at which the power boost circuit 330 of each of the individual electrical power supply systems 189, 191, 193 and 195 is to be activated. In this embodiment, in addition to specifying a time at which the power boost circuit is to be activated, the addressed record in the current boost look-up table 234 also specifies a flash intervention effect indicator F, which the processor circuit 110 is directed to temporarily store in the flash intervention effect register 290, for later use by the processor circuit under the direction of the drift control routine 236, as discussed in greater detail below.

In this regard, it will be recalled that in this embodiment, the power boost circuit 330 shown in FIG. 3 includes an inductive crowbar circuit. As discussed earlier herein, in the present embodiment, the flash feedback control routine 224 directs the processor circuit to commence the irradiance flash by applying a gate voltage to the thyristor 336, which allows the capacitor bank 328 to begin discharging through the flash lamp 182, the resistor 340, the inductor 338 and the thyristor 336. In this manner, the rate of increase of the electric current being discharged through the flash lamp 182 is effectively opposed by a resulting self-induced emf ($\epsilon=-L(di/dt)$) of the 4.7 µH inductor 338. If the comparison of measured to expected temperature values indicates that a power boost is desired at a particular time identified by the current boost look-up table 234, the processor circuit 110 applies a gate voltage to the thyristor 332 to place it in a conducting state, allowing electric current to flow through the 1.5 µH inductor 334, which has a lower self-induced emf due to its lower inductance than the inductor 338, thereby reducing the overall current-limiting effect of these components of the power control circuit. This allows the arc current to rise more quickly to a higher peak, which in turn results in a higher peak temperature of the surface 104. Thus, in this embodiment the irradiance flash is produced by an arc lamp (in this embodiment the flash lamp 182 and other flash lamps) powered by an electric current discharge, which travels through a first electrical path (in this embodiment through the inductor 338) having a first inductance to produce the initial portion of the irradiance flash, and increasing the peak temperature of the surface 104 includes causing the electric current discharge to travel through a second electrical path (in this embodiment through the inductor 334) having a second inductance less than the first inductance.

Figure 8:
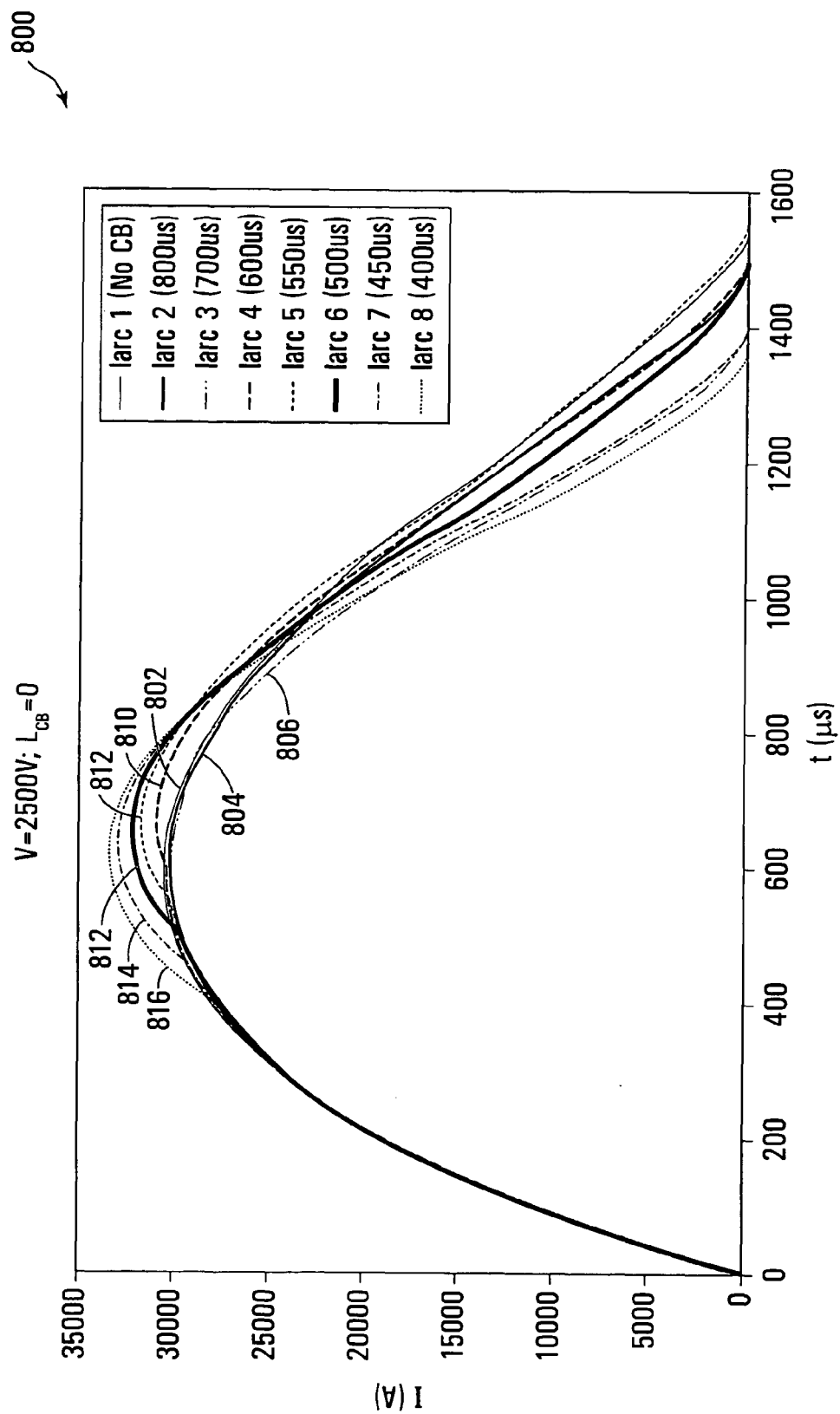
FIG. 8 is a graph illustrating electrical arc currents of an irradiance system shown in FIG. 1 used to produce an irradiance flash, when a power boost circuit is activated at different times during the flash.

Referring to FIG. 8, various curves representing the arc current over time are shown generally at 800, again for an illustrative situation in which the capacitor bank 328 is charged at 2500 V and is then abruptly discharged to produce the irradiance flash. A first curve 802 represents the arc current over the duration of the irradiance flash with no current boost, i.e., without any activation of the power boost circuit 330. A second curve 804 represents the arc current if the power boost circuit is activated 0.8 ms after the commencement of the irradiance flash; a third curve 806 represents the arc current if the power boost circuit is activated 0.7 ms after the commencement of the irradiance flash; a fourth curve 808 represents the arc current if the power boost circuit is activated 0.6 ms after the commencement of the irradiance flash; a fifth curve 810 represents the arc current if the power boost circuit is activated 0.55 ms after the commencement of the irradiance flash; a sixth curve 812 represents the arc current if the power boost circuit is activated 0.5 ms after the commencement of the irradiance flash; a seventh curve 814 represents the arc current if the power boost circuit is activated 0.45 ms after the commencement of the irradiance flash; and an eighth curve 816 represents the arc current if the power boost circuit is activated 0.4 ms after the commencement of the irradiance flash. In the examples shown in FIG. 8, activation of the power boost circuit 330 earlier than about 0.6 ms after the commencement of the flash has the effect of increasing the peak arc current, although the arc current then tends to drop off more steeply after the peak, and these effects tend to cause the surface 104 to reach a higher peak temperature than it otherwise would have reached. In contrast, activation of the power boost circuit 330 more than about 0.6 ms after the commencement of the flash does not appreciably increase the peak arc current, with the result that the peak temperature of the surface 104 is unlikely to be appreciably increased.

Alternatively, it will be appreciated that a power boost circuit and a power reduction circuit need not both be present in a particular embodiment. For example, an alternative embodiment may include only a single power reduction circuit, such as that shown at 350, for example, and may omit a power boost circuit. In such an embodiment, the capacitor bank 328 may be always overcharged, so that the measured temperature trajectory of the surface 104 will always exceed the expected temperature trajectory, with the result that the power reduction circuit 350 will always be fired, at a time determined by reference to the current reduction look-up table 232 on the basis of the comparison of measured to expected temperature values.

In this embodiment, the flash feedback control routine 224 continues to direct the processor circuit 110 to receive a new temperature measurement of the surface 104 from the ultra-fast radiometer every 10 µs, and to store each such temperature measurement with its associate time index value in the device side temperature store 280, to record the complete temperature curve of the surface 104 of the workpiece 106, as it reaches its peak temperature and subsequently cools. Thus, the actual temperature jump ΔT may be calculated from the measured temperature values ($\Delta T = T_{MAX} - T_0$).

Stage 3: Drift Control

In this embodiment, the drift control routine 236 directs the processor circuit 110 to monitor at least one thermal efficiency parameter associated with an irradiance system (in this embodiment the system 100) configured to produce the irradiance flash incident on the surface 104 of the workpiece 106. The drift control routine 236 further directs the processor circuit 110 to automatically update control information used by the irradiance system to produce the irradiance flash, in response to the monitoring of the thermal efficiency parameter. Thus, if the thermal efficiency of the system 100 gradually changes over time, the drift control routine 236 effectively configures the processor circuit to automatically compensate for such changes.

In this embodiment, monitoring the thermal efficiency parameter includes calculating the thermal efficiency parameter in response to a measurement of an actual temperature increase ΔT of the surface 104 of the workpiece caused by the irradiance flash. Alternatively, however, an energy density of radiant energy of the flash, such as an energy density of the flash arriving at the surface 104, for example, or other types of thermal efficiency parameters, may be monitored.

In the present embodiment, automatically updating control information includes automatically updating at least one stored efficiency parameter, and further includes automatically varying an energy output parameter of the irradiance flash. More particularly, in this embodiment, varying an energy output parameter includes automatically varying an output energy of the irradiance flash. In the present embodiment, this is achieved by automatically varying an amount of stored electrical charge used to produce the irradiance flash. More particularly still, in this embodiment the stored electrical charge is automatically varied by updating the system efficiency value $C_{eff(N)}$, which in this embodiment is used by the processor circuit 110 under the direction of both the main RTP routine 221 and the pre-adjustment routine 222, to calculate the desired electrical energy to be stored in the power supply system 188 to produce the irradiance flash.

In this regard, it will be recalled that in the present embodiment, the main RTP routine 221 directs the processor circuit 110 to calculate an electrical energy level $E_{CHN}$ representing the energy to be stored in the power supply system 188 to produce the irradiance flash, in response to user-specified parameters defining the desired thermal cycle (which may include $W_{ID}$, $T_{INT}$ and ΔT, for example), and to store this value $E_{CHN}$ in the charging parameters store 278. It will further be recalled that in this embodiment, the main RTP routine also directs the processor circuit 110 to determine a corresponding efficiency-adjusted electrical energy level $E_{ADJ}$ in response to the most recently stored present system efficiency value $C_{eff(N)}$. Likewise, as the present embodiment includes flash pre-adjustment, it will be recalled that the system efficiency value $C_{eff(N)}$ is also used by the processor circuit 110 under the direction of the pre-adjustment routine 222 to calculate an emissivity-compensated, efficiency-adjusted electrical energy value $E_{ADJ\_EC}$, which over-writes the previous value of $E_{ADJ}$ calculated under the direction of the main RTP routine. Thus, in order to automatically vary the amount of electrical energy used to produce the irradiance flash, in the present embodiment the processor circuit 110 updates the system efficiency value $C_{eff(N)}$ under the direction of the drift control routine 236 following execution of each thermal cycle, in order to automatically affect the electrical energy values that will be calculated by the processor circuit under the direction of the main RTP routine and/or the pre-adjustment routine for the next thermal cycle. Alternatively, the system efficiency value may be updated less frequently if desired. For example, the system efficiency value may be updated after a predetermined number of cycles, or after a predetermined time interval, or when measured temperature jump errors begin to exceed a minimum threshold, or at the discretion of a system user, or in any other suitable manner.

As previously discussed, the irradiance system 180 has an electrical-to-optical conversion efficiency $C_{EO}$, such as 44% (0.44) for example, which characterizes the efficiency of the conversion from electrical to electromagnetic energy. The system also has an optical efficiency $C_o$, such as 36% (0.36) for example, which characterizes the efficiency of the system in delivering electromagnetic energy of the irradiance flash to the surface 104 of the workpiece. Thus, the combined efficiency of the system 100 in delivering stored electrical energy to the surface 104 as electromagnetic energy is:

$$C_{eff} = C_{eo} * C_0$$

wherein $C_{eff}$ is the overall efficiency, $C_{eo}$ is the electrical-optical conversion efficiency of the irradiance system 180, and $C_0$ is the optical efficiency of the system 100 in delivering irradiance to the surface 104. (In this embodiment, $C_{eff}$=0.44*0.36=0.16.)

In practice, the system efficiency $C_{eff}$ may not be constant, but rather, may vary over time. For example, aging or deterioration of quartz windows or envelopes decreases their transmissivity, which in turn decreases the optical efficiency $C_0$. Likewise, it is possible that the electrical-optical conversion efficiency $C_{eo}$ of the irradiance system 180 may also deteriorate or otherwise change over time.

As a first order approximation, it may be assumed that $C_{eff}$ will vary linearly with the number N of "shots" or irradiance flashes, so that $C_{eff}$ after N shots may be represented in the form y=mx+b, as follows:

$$C_{eff(N)} = S_{d(n-1)} * N + O_{d(n-1)}$$

wherein:
  $S_{d(n-1)}$ is a most recent efficiency degradation slope (initially set to an estimated value);
  N is a shot number, i.e., the number of irradiance flashes that have been produced; and
  $O_{d(n-1)}$ is a most recent efficiency offset value (initially set to an estimated value).

In the present embodiment, the efficiency degradation slope value $S_{d(n-1)}$ is initially set to zero, but it adjusts itself with each execution of the drift control routine 236 as described below (for example, becoming a negative value close to zero if system efficiency is slowly decreasing). Likewise, the efficiency offset $O_{d(n-1)}$ is initially set to an estimated value of present system efficiency (for example, in the present embodiment, for N=0, the initial value of $O_{d(n-1)}$ may be set to $C_{eff}$=0.16, as discussed in greater detail earlier herein.

In this embodiment, the drift control routine 236 directs the processor circuit 110 to update the slope and offset values $S_{d(n)}$ and $O_{d(n)}$ after each flash or "shot". For each shot, the processor circuit 110 is directed to cooperate with the measurement system 102 (or more particularly, with the ultra-fast radiometer 400 that measures the temperature of the device side surface 104) to effectively measure and store a measured temperature jump value $\Delta T_M$ representing the actual temperature jump experienced by the surface 104 of the workpiece as a result of the irradiance flash. To identify this measured temperature jump value, the drift control routine 236 directs the processor circuit 110 to identify the highest temperature value stored in the device side temperature store 280 representing the peak temperature of the surface 104 during the flash, and to subtract therefrom the initial temperature value for time index value t=0 stored in the device side temperature store 280 (in this regard, the time index value t=0 corresponds to the time at which the irradiance flash was commenced, at which time the measured device side temperature should ideally have equalled the user-specified intermediate temperature $T_{INT}$ to which the workpiece 106 was to be pre-heated before commencing the flash). In this embodiment, the processor circuit 110 is directed to store the measured temperature jump value $\Delta T_M$ in the efficiency parameters store 238.

Alternatively, rather than using the measurement system 102, other suitable measurement devices may be substituted to monitor the thermal efficiency parameter. For example, in embodiments where the monitored parameter is radiant energy density rather than temperature jump, the energy density may be measured by a separate light meter (not shown) mounted on the internal wall 140 of the chamber 130.

In the present embodiment, the drift control routine 236 directs the processor circuit 110 to use the measured temperature jump value $\Delta T_M$ and the workpiece parameters $O_{TE}$ and $S_{TE}$ from the workpiece parameters store 240 corresponding to the workpiece 106 to calculate an effective electrical energy value $E_{CHM}$ corresponding to the actual measured temperature jump:

$$E_{CHM} = e^{\left(\frac{\Delta T_M - O_{TE}}{S_{TE}}\right)}$$

The drift control routine 236 then directs the processor circuit 110 to calculate the efficiency $C_{eff(N)}$ for the particular thermal cycle that has just been completed. In this embodiment, the processor circuit is directed to calculate this efficiency value as:

$$C_{meff(N)} = \frac{E_{CHM}}{E_{ADJ\_EC} * F} * C_{TE}$$

wherein:
  $E_{CHM}$ is calculated as shown immediately above;
  $E_{ADJ\_EC}$ is the efficiency-adjusted and emissivity-corrected electrical energy value stored in the charging parameters store 278, which was calculated by the processor circuit under the direction of the pre-adjustment routine 222 and which was used to determine the capacitor bank charging voltages used to produce the irradiance flash;
  $C_{TE}$ is the system efficiency at the time the workpiece-characterizing values $S_{TE}$ and $O_{TE}$ from the record in the workpiece parameters store 240 corresponding to the workpiece 106 were calculated and stored; and
  F is the flash intervention effect indicator which was stored in the flash intervention effect register 290 by the processor circuit under the direction of the flash feedback control routine 224, as discussed earlier herein.

In the present embodiment, the latter flash intervention effect indicator F is used to compensate for the fact that if either of the power reduction circuits 320 or 350 was activated by the processor circuit under the direction of the flash feedback control routine 224, the total electrical energy supplied to the flash lamps to produce the irradiance flash would have been less than $E_{ADJ\_EC}$ and the peak electrical power supplied to the flash lamps may have also been reduced, depending upon the time at which the power reduction circuit(s) was activated. Thus, in this embodiment, each record in the current reduction look-up table 232 contains a value for the flash intervention effect indicator F, which in the present embodiment is empirically determined. Similarly, in the present embodiment, each record in the current boost look-up table 234 also contains a corresponding value for the flash intervention effect indicator F.

Alternatively, in embodiments where flash feedback control is omitted, the flash intervention effect indicator F is omitted from the above equation. Similarly, in embodiments where pre-adjustment (emissivity compensation) is not provided, $E_{ADJ\_EC}$ in the above equation is replaced with the original electrical energy value $E_{ADJ}$ that was calculated by the processor circuit 110 and stored in the charging parameters store 278 under the direction of the main RTP routine 221, as discussed earlier herein. Thus, in an illustrative, simplified alternative embodiment in which neither a pre-adjustment routine 222 nor a flash feedback control routine 224 is provided, the efficiency $C_{meff(N)}$ for the particular thermal cycle that has just been completed is calculated as $$C_{meff(N)} = \frac{E_{CHM}}{E_{ADJ}} * C_{TE}$$

In the present embodiment, the slope and offset values $S_{d(n)}$ and $O_{d(n)}$ are then updated. In this embodiment, this is achieved by performing a moving linear least squares (LLS) fit on a most recent number M of such measured efficiencies $C_{meff(N)}$:

$$O_{d(n)} = \frac{\left(\sum_{i=N-M}^{N} C_{meff(i)}\right)\left(\sum_{i=N-M}^{N} i^2\right) - \left(\sum_{i=N-M}^{N} i\right)\left(\sum_{i=N-M}^{N} i * C_{meff(i)}\right)}{M * \sum_{i=N-M}^{N} i^2 - \left(\sum_{i=N-M}^{N} i\right)^2}$$

$$S_{d(n)} = \frac{M * \sum_{i=N-M}^{N} i * C_{meff(i)} - \left(\sum_{i=N-M}^{N} i\right)\left(\sum_{i=N-M}^{N} C_{meff(i)}\right)}{M * \sum_{i=N-M}^{N} i^2 - \left(\sum_{i=N-M}^{N} i\right)^2}$$

The number of samples M used to calculate the above slope and offset calculations will determine the filter characteristics of the drift control routine. In general, if the number of samples M is too low, this may cause "jitter", i.e., efficiency corrections between successive runs being undesirably large. Conversely, if M is too large, the system may be too slow in correcting for efficiency changes over time. In the present embodiment, M is preferably less than 100. More particularly, in this embodiment M=75. Alternatively, other values of M, whether above or below 100, may be substituted.

Alternatively, methods other than a moving linear least squares fit may be used to update the efficiency parameters. For example, other filtering methods such as moving average or exponentially weighted moving average may be substituted. More generally, the degradation of system efficiency need not be approximated as a linear degradation of the form y=mx+b or C=SN+O, and other functional relationships and updating methods may be substituted.

The processor circuit 110 is then directed to calculate a revised overall efficiency value $C_{eff(N)}$ as discussed above, using the updated slope and offset values. In this embodiment, the processor circuit is directed to store the updated slope, offset and efficiency values in the efficiency parameters stores 238 and 286. This updated efficiency value $C_{eff(N)}$ will then be taken into account by the processor circuit 110 under the direction of the main RTP routine 221 in setting the electrical charge energy and voltage values for the next thermal cycle, as discussed in greater detail earlier herein in connection with the main RTP routine 221.

If desired, prior to storing the updated efficiency parameters $S_{(n)}$, $O_{d(n)}$ and $C_{eff(N)}$, the drift control routine 236 may direct the processor circuit 110 to compare these updated parameters to their most recent values, and if the change in any one of these parameters exceeds a threshold maximum adjustment, the processor circuit may be directed to instead adjust the relevant efficiency parameter(s) by only the maximum threshold adjustment, rather than by the actual (greater) adjustments calculated above. This approach may assist in preventing the efficiency values from changing too much from cycle to cycle, thereby preventing any isolated anomaly that may arise in a particular cycle from having too great an effect on the next cycle.

The foregoing assumes that the workpiece 106 is one of the pre-characterized types of workpieces, for which characterizing values $S_{TE}$, $O_{TE}$ and $C_{TE}$ have been stored in a corresponding record in the workpiece parameters store 240. Alternatively, for thermal cycles in which the processed workpiece was not one of the pre-characterized types and no such characterizing values are available, the present system efficiency value may be updated in other manners. For example, it may be assumed that the change in system efficiency from cycle to cycle is accurately characterized by the most recently updated efficiency degradation slope value $S_d$ stored in the efficiency parameters stores 238 and 286, so that for a single cycle, $C_{eff(N)}=C_{eff(N-1)}+S_{d(N-1)}$. The updated system efficiency value $C_{eff(N)}$ may be stored in the efficiency parameters stores 238 and 286, although in such a case, the efficiency degradation slope value need not be updated.

In this embodiment, following the updating of the system efficiency parameters as described above, the drift control routine 236 directs the processor circuit 110 to compare the updated system efficiency value $C_{eff(N)}$ to a predefined minimum system efficiency threshold $C_{MIN}$. If the present system efficiency value $C_{eff(N)}$ has reached or fallen below the minimum system efficiency threshold $C_{MIN}$, the drift control routine directs the processor circuit to signal a user of the system 100, to indicate that the system is due for service and maintenance.

Other Aspects and Alternatives

Figure 9:
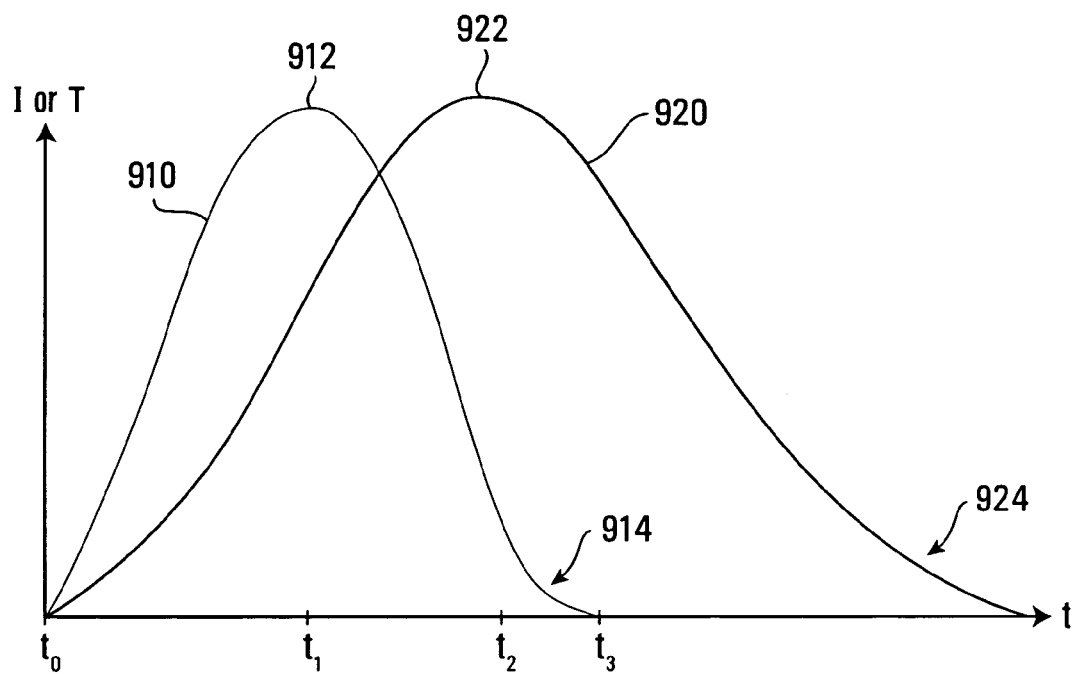
FIG. 9 is a graph illustrating a first arc current and a corresponding workpiece surface temperature trajectory.
Figure 10:
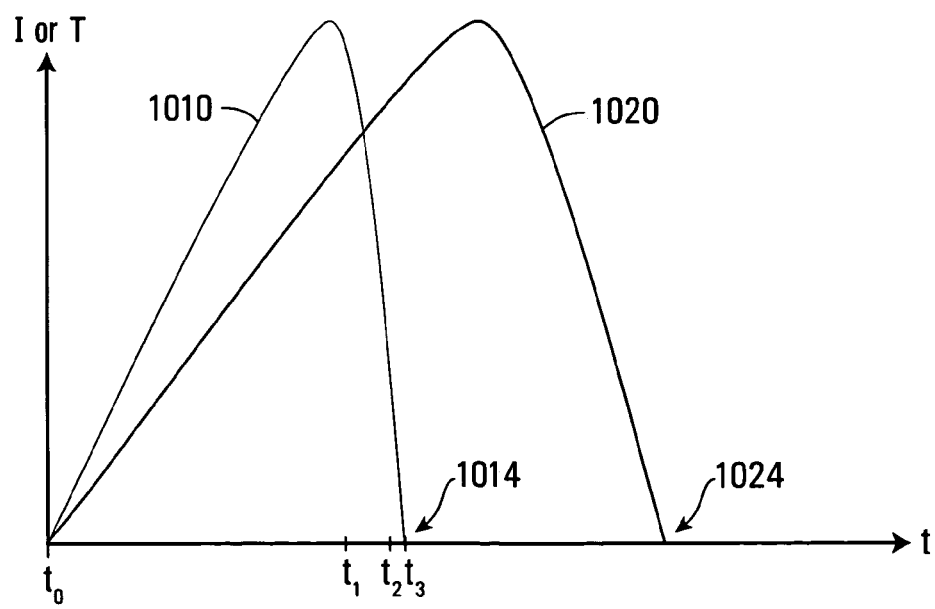
FIG. 10 is a graph illustrating a second arc current and a corresponding workpiece surface temperature trajectory.

Referring to FIGS. 1, 9 and 10, in this embodiment the processor circuit 110 is configured to cooperate with the irradiance system 180 and the power supply system 188 to supply an electrical pulse such as that shown at 1010 in FIG. 10, to an irradiance device configured to produce the irradiance flash incident on the workpiece 106. In this embodiment, the electrical pulse 1010 has a fall time ($t_3$-$t_1$) that is less than its rise time ($t_1$-$t_0$).

In this regard, referring to FIGS. 9 and 10, an exemplary arc current discharged through the flash lamp 182 to produce an irradiance flash incident on the surface 104 of the workpiece is shown generally at 910. The temperature of the surface 104 of the workpiece is shown generally at 920, and lags the arc current when plotted on the same time-line as shown in FIG. 9 (in the illustrative example shown in FIG. 9, a peak surface temperature 922 lags a peak arc current 912 by approximately 0.4 ms). In this example, the arc current 910 has a temporal region of current instability 914 as the arc current drops off, which in turn results in a temporal region of temperature instability 924 of the temperature 920 of the surface 104 of the workpiece. To further improve repeatability of thermal processing, in this embodiment the system 100 is configured to reduce these regions of instability.

To achieve this, in this embodiment the processor circuit 110 and the power supply system 188 are configured to cause an electric pulse similar to the electric pulse 1010 shown in FIG. 10 to be supplied to each of the flash lamps of the irradiance system 180. In this regard, because the electric pulse 1010 has a fall time that is faster than its rise time, a region of instability 1014 of the electric pulse 1010 has a much steeper slope and hence a shorter duration ($t_3$-$t_2$) than the corresponding region of instability 914 of the arc current 910 shown in FIG. 9. Therefore, a corresponding temporal region of instability 1024 in the workpiece surface temperature 1020 also has a steeper slope and shorter duration than the region of instability 924 shown in FIG. 9. Accordingly, using the electric pulse 1010 shown in FIG. 10 effectively reduces the current and temperature instabilities in these regions, thereby improving the repeatability of thermal processes using the system 100.

In this embodiment, the pulse 1010 includes a generally sawtooth-shaped pulse. If desired, the sawtooth-shape of the pulse may be even more sharply pronounced. For example, if an almost-square input waveform is available, an inductor may be used to transform such a waveform into a generally triangular pulse having a fall time less than its rise time.

In this embodiment, the processor circuit is configured to cause the pulse 1010 to abruptly transition from the rise time to the fall time. More particularly, in this embodiment the processor circuit is configured to fire a crowbar circuit to cause the pulse to transition from the rise time to the fall time. In this embodiment, the crowbar circuit is connected in parallel with the flash lamp. Thus, the crowbar circuit used for this purpose may include a power reduction circuit similar to that shown at 350 in FIG. 3, or alternatively, may include power reduction circuits similar to those shown in FIGS. 12 and 13, discussed below. The firing of such a crowbar circuit effectively amounts to shorting across the irradiance device to cause the pulse to transition from the rise time to the fall time.

Figure 11:
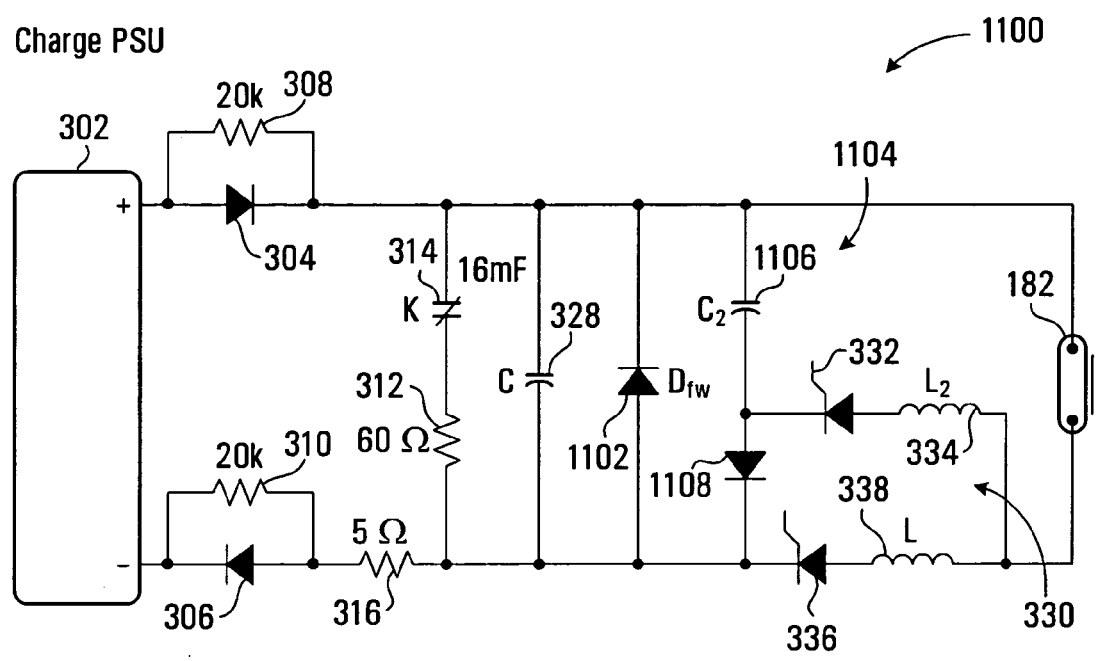
FIG. 11 is a circuit diagram of a power control circuit according to an alternative embodiment of the invention.

Referring to FIGS. 1, 2, 3 and 11, a power control circuit according to an alternative embodiment of the invention is shown generally at 1100 in FIG. 11. In this embodiment, the power control circuit 1100 is somewhat similar to the power control circuit 300 shown in FIG. 3, and includes the first power boost circuit 330. However, unlike the power control circuit 300, the power control circuit 1100 also includes a second power boost circuit 1104, which in turn includes a supplementary capacitor 1106 and a diode 1108. In this embodiment, the capacitor 1106 has a capacitance of 667 µF. In the present embodiment, when the irradiance flash is commenced, the thyristor 332 is in a non-conducting state, which, coupled with the presence of the diode 1108, prevents the capacitor 1106 from discharging through the flash lamp 182. However, if the processor circuit 110 under the direction of the flash feedback control routine 224 determines that it is desirable to increase the peak power output of the remaining portion of the flash, the processor circuit applies a gate voltage to the thyristor 332, thereby placing it in a conducting state, with the resulting current-boosting effect as described above. However, in addition to the previously discussed current-boosting effect, placing the thyristor 332 in a conducting state allows the supplementary capacitor 1106 to discharge through the flash lamp 182 and the inductor 334, thereby providing an additional current boost. Thus, in this embodiment increasing the peak power output of the irradiance flash includes discharging a supplementary capacitor through the flash lamp 182 and the inductor 334.

Although the embodiments described above employ thyristors for convenient control of electric current flow by the processor circuit 110, alternatively, other solid state devices, or more generally, other suitable circuitry, may be substituted. For example, Insulated Gate Bipolar Transistors (IGBTs) may be substituted for the thyristors 322, 332, 336 and 352, if desired. In this regard, although IGBTs typically cannot carry as much current as thyristors, IGBTs with increasingly larger current-carrying capacities are gradually becoming more widely available. In addition, IGBTs have the added advantage that they can be switched off, whereas a thyristor, once placed in a conducting state by applying a gate voltage, will continue to conduct when the gate voltage is removed, for as long as the electric current travelling through the thyristor exceeds a threshold holding current.

Although the main embodiment described above included a plurality of power control circuits, namely, the two power reduction circuits 320 and 350 and the power boost circuit 330, alternatively, other embodiments may include only one such power control circuit, or other types of circuits.

For example, in one alternative embodiment, only the power reduction circuit 350 is provided, while the power reduction circuit 320 and the power boost circuit 330 are omitted. In such an embodiment, if desired, the workpiece characterizing values stored in the workpiece parameters store 240 may be modified to ensure that the resulting electrical charge used to produce the irradiance flash is always more than sufficient to achieve the desired peak temperature, so that intervention by the power reduction circuit 350 is always required. In this regard, such embodiments may be particularly advantageous for certain refined applications. For example, in the annealing of semiconductor wafers for ion/dopant activation, although variations in the peak temperature of the device side of the wafer strongly affect process results (activation and diffusion), variations in the shape of the temperature-time curve may also be significant for some embodiments. For example, different shapes of the temperature-time curve within 100° C. of an identical peak temperature may cause variations that may be significant, depending upon the particular repeatability and consistency requirements in question. The temperature-time curve typically lags but may also differ in shape from the electric current-time curve of the electric pulse that generates the irradiance flash, and relatively minor changes in the current pulse shape may cause potentially significant variations in the shape of the temperature-time curve of the device side of the wafer. Advantageously, therefore, embodiments that always require intervention by the power reduction circuit 350 will produce more consistent electric current pulse shapes from wafer to wafer, and hence more consistent temperature-time curve shapes of the device side, than embodiments in which such intervention is sometimes but not always required.

Similarly, in another embodiment, only the power reduction circuit 320 is provided. If desired, the workpiece characterizing values stored in the workpiece parameters store 240 may be analogously modified to ensure that intervention by the power reduction circuit 320 is always required.

Conversely, in other embodiments, only the power boost circuit 330 shown in FIG. 3, or the modification thereof shown in FIG. 11, may be provided. If desired, in such an embodiment, the workpiece characterizing values stored in the workpiece parameters store 240 may be modified to ensure that the resulting electrical charge used to produce the irradiance flash is always slightly insufficient to achieve the desired peak temperature, so that intervention by the power boost circuit 330 is always required.

Although the specific embodiments described above may be employed to achieve consistent thermal cycles and consistent peak temperatures from cycle to cycle, alternatively, it may be desirable in some embodiments to intentionally seek slightly different peak temperatures to improve consistency of the ultimate results of the process, even for ostensibly identical workpieces. In this regard, if the process results in a particular embodiment may be significantly affected by the shape of the temperature-time curve rather than merely by the peak temperature, then the pulse-shape changes produced by the various pulse modification circuits described herein may actually produce slightly different process results if the same peak temperature is achieved but with different temperature-time curves. For example, for some applications involving ion/dopant activation and diffusion in the device side of a semiconductor wafer, different shapes of the temperature-time curve within 100° C. of an identical peak temperature may cause variations that may be significant, depending upon the particular repeatability and consistency requirements in question. In such an embodiment, if real-time device side temperature measurements indicate that the device side of the wafer is heating toward the peak temperature more quickly than expected (e.g. due to a greater-than-expected device side emissivity), so that intervention by the current reduction circuit 350 is required earlier than expected, then the resulting change in the shape of the temperature-time curve of the device side may produce slightly different ion/dopant activation and diffusion results, even if the desired peak temperature is precisely achieved. In such an embodiment, therefore, the timing of the activation of the relevant pulse modification circuit may be adjusted to intentionally cause the peak temperature of the device side to deviate from the previously defined desired peak temperature, so that the resulting deviation from the desired peak temperature compensates for the deviation from the expected temperature-time curve shape, thereby achieving more consistent overall ion/dopant activation and diffusion results. Such adjustments may be provided through empirically determined look-up tables corresponding to each workpiece type, for example.

Alternatively, however, in other embodiments with less stringent repeatability and consistency requirements, the effects of variations in temperature-time curve shape may be negligible for a particular application in comparison to variations in peak temperature, with the result that the former may be disregarded.

In alternative embodiments, other types of power reduction and/or power boost circuits may be provided. For example, referring to FIGS. 1, 2, 3 and 12, a power control circuit according to an alternative embodiment of the invention is shown generally at 1200 in FIG. 12. In this embodiment, the power control circuit 1200 includes a power reduction circuit 1202. In the present embodiment, the power reduction circuit 1202 is somewhat similar to the power reduction circuit 350 shown in FIG. 3, but omits the resistor 356. Thus, in this embodiment the power reduction circuit 1202 includes a crowbar circuit, which in turn consists of a switching circuit and an inductor 1206. In this embodiment, the switching circuit consists of a single switch element 1204. More particularly, in this embodiment the switch element 1204 is a semiconductor switch. More particularly still, in this embodiment the switch element 1204 is a thyristor, although alternatively, other types of switches, such as IGBTs (Insulated Gate Bipolar Transistors) for example, may be substituted. As some types of thyristors can be damaged by excessive rates of current increase, in this embodiment the inductor 1206 serves to effectively limit the rate of increase of current dI/dt, to protect the switch element 1204 from potential damage. In this embodiment, the inductance of the inductor 1206 (which need not be the same as that of the inductor 354) is selected to be as low as possible to serve this latter purpose, while providing an impedance much less than that of the flash lamp 182. In the present embodiment, the thyristor 336 is placed in a conducting state to allow the capacitor bank 328 to begin discharging through the flash lamp 182, to produce the irradiance flash. As discussed above in connection with the flash feedback control routine 224, if temperature measurements of the surface 104 of the workpiece during the initial portion of the flash indicate that the surface 104 is being heated too quickly and will likely exceed the desired peak temperature, the processor circuit applies a gate voltage to the switch element 1204 at a time determined by the processor circuit under the direction of the flash feedback control routine 224, to cause the switch element 1204 to transition from a non-conducting state to a conducting state, thereby allowing the remaining electrical charge stored in the capacitor bank 328 to begin discharging through the switch element 1204 and the inductor 1206 rather than through the flash lamp 182. Advantageously, such activation of the power reduction circuit 1202 results in an even faster termination of the irradiance flash than the power reduction circuit 350.

Figure 12:
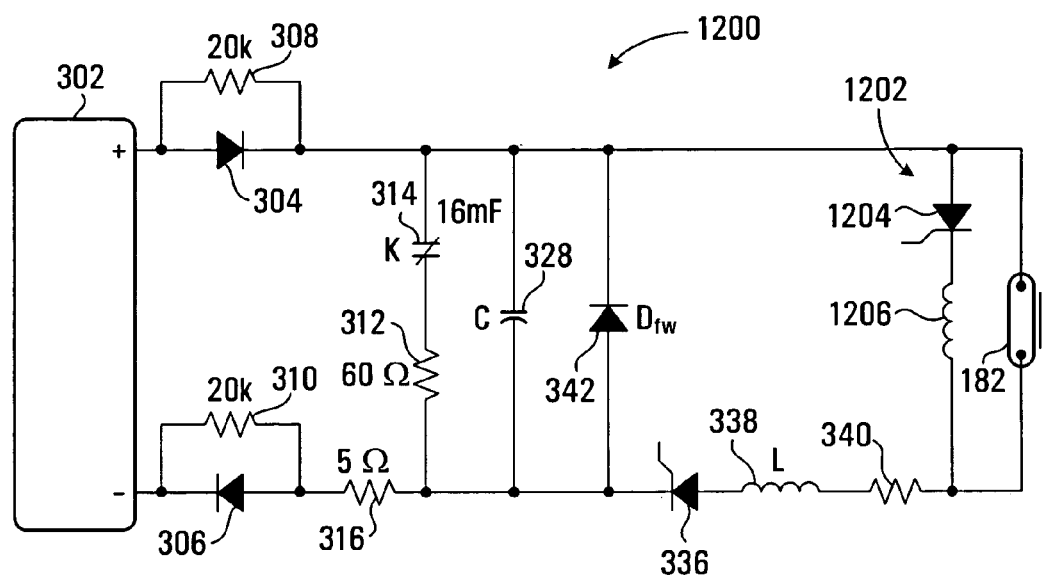
FIG. 12 is a circuit diagram of a power control circuit according to another alternative embodiment of the invention.
Figure 13:
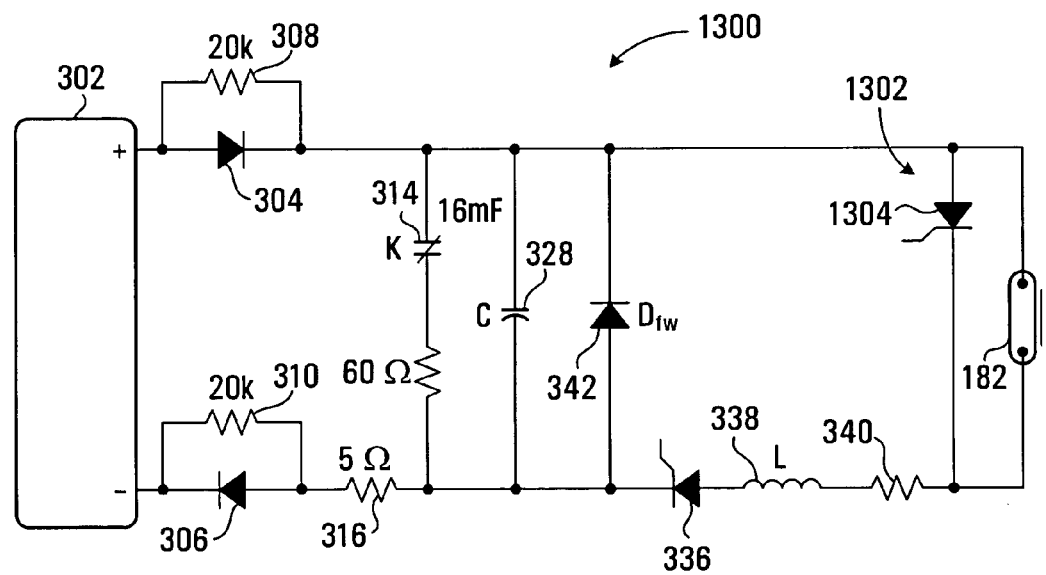
FIG. 13 is a circuit diagram of a power control circuit according to yet another alternative embodiment of the invention.

Referring to FIGS. 1, 2, 3, 12 and 13, a power control circuit according to yet another alternative embodiment of the invention is shown generally at 1300 in FIG. 13. In this embodiment, the power control circuit 1300 includes a power reduction circuit 1302. In the present embodiment, the power reduction circuit 1302 is somewhat similar to the power reduction circuit 1202 shown in FIG. 12, but omits the inductor 1206. Thus, in this embodiment the power reduction circuit 1302 includes a crowbar circuit, which in turn consists of a switching circuit. More particularly, in this embodiment the switching circuit consists of a single switch element 1304. In this embodiment, the switch element is a semiconductor switch. More particularly, in this embodiment the switch element 1304 is a thyristor, although alternatively, other types of switches, such as IGBTs (Insulated Gate Bipolar Transistors) for example, may be substituted. In this regard, although thyristors and IGBTs have historically tended to be sensitive to excessive rates of current increase, thyristors and IGBTs with increasingly greater tolerance to such excessive current rise rates are becoming increasingly available. Thus, depending upon the magnitudes of electrical current and rates of change thereof in a particular embodiment, the switch element 1304 may be provided in isolation, without the need for an inductor to protect it from the rapid rate of current increase when it is placed in a conducting state by the processor circuit 110 under the direction of the flash feedback control routine 224. If a single switch element 1304 with sufficient robustness is not available for a particular application, various system modifications may be made. For example, a larger number of flash lamps and power control circuits may be provided, so that each power reduction circuit 1302 is subjected to lower overall currents and current rise rates.

Or, as a further alternative, rather than consisting of a single switch element 1304, the switching circuit of the power reduction circuit 1302 may instead consist of a plurality of switch elements. For example, rather than a single thyristor or a single IGBT, the switching circuit may include a plurality of thyristors in parallel with one another, or a plurality of IGBTs in parallel with one another. Thus, in an illustrative alternative embodiment, the switching circuit may include a number of parallel IGBTs selected so that there is one IGBT for every 5 kA of peak current, for example.

Similarly, referring back to FIG. 12, a plurality of switch elements in parallel may be substituted for the single switch element 1204, if desired.

Although each of the power reduction circuits 1202 and 1302 in FIGS. 12 and 13 has been shown as being connected in parallel with the flash lamp 182, alternatively, either of these power reduction circuits may be instead connected in parallel with the capacitor bank 328, similar to the connection of the power reduction circuit 320 shown in FIG. 3, for example. Connection of the power reduction circuits in parallel with the flash lamp rather than with the capacitor tends to produce a faster fall time of the electrical discharge and of the resulting irradiance flash, which in turn tends to advantageously result in faster cooling of the surface 104, less dopant diffusion and lower thermal stress in the workpiece, and may also improve the lifespan of the electrodes of the flash lamp, although the importance or lack thereof of these advantages may vary between different applications and embodiments.

Although illustrative embodiments have been described using four flash-lamps, alternatively, a smaller number of flash lamps, such as one for example, may be substituted if desired. Conversely, a much larger number of flash lamps, such as 30, 40 or more, for example, may be substituted. Likewise, different types of flash lamps may be substituted. For example, the irradiance flash may instead be generated by a microwave pulse generator, if desired.

Referring back to FIG. 2, if desired, to facilitate fast throughput, the memory device 260 may be divided into a "present" area for storing information relating to a workpiece presently supported in the chamber 130 for thermal processing, and a "next" area for storing information relating to a workpiece that is currently being measured outside the chamber and will be inserted into the chamber 130 for processing when the processing of the "present" workpiece has been completed.

More generally, while specific embodiments of the invention have been described and illustrated, such embodiments should be considered illustrative of the invention only and not as limiting the invention as construed in accordance with the accompanying claims.

What is claimed is:

1. A method comprising:
   a. monitoring at least one thermal efficiency parameter of an irradiance system configured to produce an irradiance flash incident on a surface of a semiconductor workpiece, wherein monitoring comprises calculating the at least one thermal efficiency parameter of the irradiance system; and
   b. automatically updating control information used by the irradiance system to produce the irradiance flash, in response to the monitoring of the thermal efficiency parameter;
   wherein calculating the at least one thermal efficiency parameter of the irradiance system comprises calculating a combined efficiency parameter representing an electrical-to-optical conversion efficiency and an optical delivery efficiency of the irradiance system.

2. The method of claim 1 wherein calculating comprises calculating the at least one thermal efficiency parameter of the irradiance system in response to a measurement of an actual temperature increase of the surface of the workpiece caused by the irradiance flash.

3. The method of claim 1 wherein monitoring comprises monitoring energy density of radiant energy of the flash arriving at the surface.

4. The method of claim 1 wherein automatically updating comprises automatically updating at least one stored efficiency parameter.

5. The method of claim 1 wherein automatically updating comprises automatically varying an output energy of the irradiance flash.

6. The method of claim 5 wherein automatically varying comprises automatically varying an amount of stored electrical charge used to produce the irradiance flash.

7. The method of claim 1 further comprising:
   a) predicting a heating effect of the irradiance flash upon the surface of the workpiece, in response to a measurement of a heating parameter of the surface; and
   b) pre-adjusting the irradiance flash, in response to the predicted heating effect.

8. The method of claim 7 wherein predicting comprises predicting respective heating effects of a similar irradiance flash to be incident upon respective surfaces of a plurality of similar workpieces, in response to respective measurements of respective heating parameters of the respective surfaces.

9. The method of claim 8 wherein the workpieces are ostensibly identical.

10. The method of claim 7 wherein predicting the heating effect of the irradiance flash comprises predicting a peak temperature of the surface.

11. The method of claim 7 wherein predicting the heating effect of the irradiance flash comprises predicting an amount of energy of the irradiance flash to be absorbed by the surface.

12. The method of claim 7 further comprising measuring the heating parameter of the surface.

13. The method of claim 12 wherein measuring the heating parameter comprises measuring a reflectivity of the surface.

14. The method of claim 12 wherein measuring the heating parameter comprises measuring an emissivity of the surface.

15. The method of claim 12 wherein measuring comprises measuring the heating parameter in a wavelength spectrum corresponding to the irradiance flash.

16. The method of claim 15 wherein measuring comprises measuring a plurality of values of the heating parameter at a plurality of respective wavelengths of the spectrum.

17. The method of claim 12 wherein measuring the heating parameter comprises compensating for small-scale angular variations in the heating parameter.

18. The method of claim 17 wherein compensating comprises measuring the heating parameter over a sufficiently large area of the surface to effectively average out the small-scale angular variations.

19. The method of claim 18 wherein the surface comprises a device side of a semiconductor wafer, and wherein measuring the heating parameter over a sufficiently large area comprises measuring the heating parameter over an area at least about 1 cm wide.

20. The method of claim 19 wherein measuring comprises measuring the heating parameter over an area at least about 2 cm wide.

21. The method of claim 17 wherein measuring comprises measuring the heating parameter with a fiber optic probe.

22. The method of claim 14 wherein measuring the emissivity comprises illuminating the surface with an irradiance spectrum comprising wavelengths of the irradiance flash.

23. The method of claim 22 wherein illuminating comprises illuminating the surface with an irradiance spectrum produced by an illumination source other than a source of the irradiance flash.

24. The method of claim 23 wherein the illumination source further comprises a filter configured to simulate an irradiance spectrum of the source of the irradiance flash.

25. The method of claim 22 wherein pre-adjusting comprises pre-adjusting a future irradiance flash to be incident upon a first surface of a first workpiece, contemporaneously with an incidence of a present irradiance flash upon a similar surface of a second workpiece.

26. The method of claim 7 wherein predicting the heating effect comprises predicting the heating effect in response to a measurement of an emissivity of the surface and an amount of energy to be delivered to the surface by the irradiance flash.

27. The method of claim 16 wherein predicting the heating effect comprises convolving the plurality of values of the heating parameter at the plurality of respective wavelengths of the spectrum with a plurality of irradiance values indicative of respective amounts of irradiance at the respective wavelengths to be delivered to the surface by the flash.

28. The method of claim 27 wherein convolving comprises convolving a plurality of absorptivity values of the surface at the plurality of respective wavelengths with a plurality of irradiance energy values indicative of respective amounts of radiant energy at the respective wavelengths to be delivered to the surface by the flash.

29. The method of claim 28 wherein predicting the heating effect further comprises summing a plurality of absorbed energy values resulting from the convolving.

30. The method of claim 7 wherein pre-adjusting comprises pre-adjusting an amount of stored electrical energy to be used to generate the irradiance flash.

31. The method of claim 30 wherein the stored electrical energy comprises electrical charge stored in a capacitor bank.

32. The method of claim 1, further comprising supplying an electrical pulse to an irradiance device configured to produce the irradiance flash incident on the workpiece, wherein a fall time of the pulse is less than a rise time of the pulse.

33. The method of claim 32 wherein the pulse comprises a sawtooth-shaped pulse.

34. The method of claim 32 wherein supplying comprises causing the pulse to abruptly transition from the rise time to the fall time.

35. The method of claim 34 wherein causing comprises firing a crowbar circuit to cause the pulse to transition from the rise time to the fall time.

36. The method of claim 34 wherein causing comprises shorting across the irradiance device to cause the pulse to transition from the rise time to the fall time.

37. The method of claim 1, wherein calculating the combined efficiency parameter comprises calculating a slope value and an offset value of a linear model of the combined efficiency parameter.

38. The method of claim 1, wherein automatically updating comprises automatically updating the control information less frequently than after each irradiance flash.

39. The method of claim 38, wherein automatically updating comprises automatically updating the control information after a predetermined number of thermal cycles of the irradiance system.

40. The method of claim 38, wherein automatically updating comprises automatically updating the control information after a predetermined time interval.

41. A method comprising:
a) monitoring at least one thermal efficiency parameter of an irradiance system configured to produce an irradiance flash incident on a surface of a semiconductor workpiece, wherein monitoring comprises calculating the at least one thermal efficiency parameter of the irradiance system;
b) automatically updating control information used by the irradiance system to produce the irradiance flash, in response to the monitoring of the thermal efficiency parameter;
c) generating the irradiance flash incident upon the surface of the workpiece;
d) measuring a temperature of the surface of the workpiece during an initial portion of the irradiance flash incident on the surface; and
e) controlling a power of a remaining portion of the irradiance flash, in response to the temperature.

42. The method of claim 41 wherein the irradiance flash has a duration of less than a thermal conduction time of the workpiece.

43. The method of claim 41 wherein the irradiance flash delivers energy to the surface at a rate of at least about 1 MW.

44. The method of claim 41 wherein the initial portion has a duration of less than about one millisecond.

45. The method of claim 41 wherein the initial portion has a duration of less than about one-half millisecond.

46. The method of claim 41 wherein measuring comprises obtaining a plurality of measurements of the temperature of the surface at a plurality of respective times during the initial portion of the irradiance flash.

47. The method of claim 41 wherein measuring the temperature comprises measuring the temperature with a radiometer.

48. The method of claim 47 wherein the radiometer comprises an InGaAs photodiode.

49. The method of claim 41 further comprising comparing the temperature to an expected temperature.

50. The method of claim 46 further comprising comparing at least one of the plurality of temperature measurements to an expected temperature trajectory.

51. The method of claim 41 wherein controlling comprises modifying the remaining portion of the irradiance flash to reduce a peak temperature of the surface.

52. The method of claim 51 wherein modifying comprises reducing an energy output of the remaining portion of the irradiance flash.

53. The method of claim 52 wherein reducing comprises firing a crowbar circuit in communication with a source of the irradiance flash and an electrical power supply of the source.

54. The method of claim 52 wherein reducing comprises firing a crowbar circuit connected in parallel with a flash lamp or a capacitor bank.

55. The method of claim 41 wherein controlling comprises modifying the remaining portion of the irradiance flash to increase a peak temperature of the surface.

56. The method of claim 55 wherein controlling comprises increasing a peak power output of the remaining portion of the irradiance flash.

57. The method of claim 56 wherein increasing comprises firing an inductive crowbar circuit in communication with a source of the irradiance flash and an electrical power supply of the source.

58. The method of claim 56 wherein the irradiance flash is produced by an arc lamp powered by an electric current discharge, wherein the electric current discharge travels through a first electrical path having a first inductance to produce the initial portion of the irradiance flash, and wherein increasing comprises causing the electric current discharge to travel through a second electrical path having a second inductance less than the first inductance.

59. The method of claim 58 wherein increasing further comprises discharging a capacitor through the arc lamp.

* * * * *